United States Patent
Lee et al.

(10) Patent No.: US 12,507,496 B2
(45) Date of Patent: Dec. 23, 2025

(54) IMAGE SENSOR

(71) Applicant: Samsung Electronics Co., Ltd., Suwon-si (KR)

(72) Inventors: Kanghun Lee, Yongin-si (KR); Seungjoo Nah, Gwangju (KR); Heegeun Jeong, Suwon-si (KR); Mangeun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 695 days.

(21) Appl. No.: 17/099,880

(22) Filed: Nov. 17, 2020

(65) Prior Publication Data
US 2021/0335862 A1    Oct. 28, 2021

(30) Foreign Application Priority Data
Apr. 22, 2020    (KR) .................. 10-2020-0048593

(51) Int. Cl.
*H10F 39/00*    (2025.01)
*H10F 39/12*    (2025.01)
*H10F 39/18*    (2025.01)

(52) U.S. Cl.
CPC ......... *H10F 39/807* (2025.01); *H10F 39/182* (2025.01); *H10F 39/199* (2025.01); *H10F 39/8053* (2025.01); *H10F 39/8063* (2025.01); *H10F 39/811* (2025.01)

(58) Field of Classification Search
CPC ... H01L 27/1463; H10F 39/807; H10F 39/811
See application file for complete search history.

(56) References Cited

U.S. PATENT DOCUMENTS

| | | | |
|---|---|---|---|
| 8,294,203 B2 | 10/2012 | Noort et al. | |
| 9,160,949 B2 | 10/2015 | Zhang et al. | |
| 9,373,656 B2 | 6/2016 | Park | |
| 9,524,995 B2 | 12/2016 | Koo et al. | |
| 10,304,887 B2 | 5/2019 | Kim et al. | |
| 10,332,925 B2 | 6/2019 | Oh et al. | |
| 10,748,955 B2 | 8/2020 | Oh et al. | |
| 11,108,982 B2 * | 8/2021 | Shimotsusa | H10F 39/813 |
| 2011/0025892 A1 | 2/2011 | Hibbeler et al. | |
| 2014/0246707 A1 * | 9/2014 | Koo | H10F 39/80373 257/230 |
| 2015/0255495 A1 * | 9/2015 | Park | H10F 39/186 257/446 |

(Continued)

FOREIGN PATENT DOCUMENTS

CN    106856201 A    6/2017

*Primary Examiner* — Ali Naraghi
(74) *Attorney, Agent, or Firm* — Muir Patent Law, PLLC

(57) ABSTRACT

Disclosed is an image sensor comprising a substrate that has a first surface and a second surface that face each other, an isolation pattern that defines a plurality of pixel regions in the substrate, a plurality of contact plugs on the first surface of the substrate and coupled to the isolation pattern, and a plurality of first micro-lens patterns on the second surface of the substrate. The contact plugs include a first contact plug and a second contact plug that neighbor each other. A portion of the isolation pattern extends to run across a first region and a second region in the substrate. The first region vertically overlaps the first contact plug. The second region vertically overlaps the second contact plug.

20 Claims, 21 Drawing Sheets

(56) References Cited

U.S. PATENT DOCUMENTS

| | | |
|---|---|---|
| 2016/0056200 A1 | 2/2016 | Lee et al. |
| 2016/0204158 A1 | 7/2016 | Hsu et al. |
| 2017/0104020 A1* | 4/2017 | Lee ...................... H10F 39/807 |
| 2017/0170229 A1 | 6/2017 | Oh et al. |
| 2018/0190694 A1* | 7/2018 | Ihara ..................... H10F 39/802 |
| 2018/0190707 A1* | 7/2018 | Lee .................... H10F 39/8037 |
| 2019/0043901 A1* | 2/2019 | Honda ................... H01L 21/76 |
| 2019/0252442 A1* | 8/2019 | Tanaka ................. H10F 77/413 |

* cited by examiner

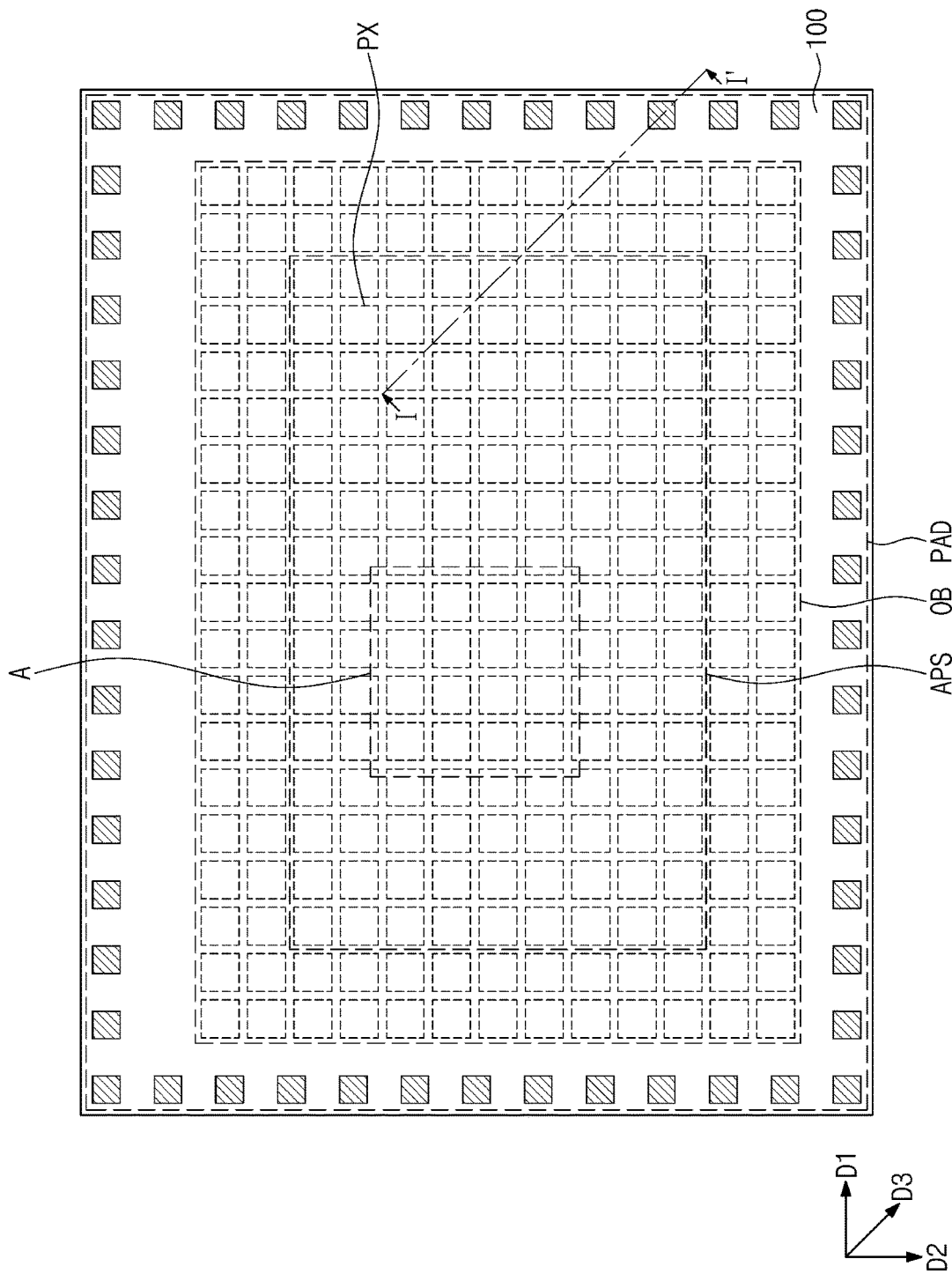

IMAGE SENSOR

CROSS-REFERENCE TO RELATED APPLICATION

This U.S. nonprovisional application claims priority under 35 U.S.C § 119 to Korean Patent Application No. 10-2020-0048593, filed on Apr. 22, 2020, in the Korean Intellectual Property Office, the disclosure of which is hereby incorporated by reference in its entirety.

BACKGROUND

The present inventive concepts relate to an image sensor, and more particularly, to an image sensor including a contact plug.

An image sensor is a device to convert optical images into electrical signals. An image sensor can be classified into a charge coupled device (CCD)-type and a complementary metal oxide semiconductor (CMOS)-type. A CMOS-type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

Some example embodiments of the present inventive concepts provide an image sensor with improved image quality.

An object of the present inventive concepts is not limited to that mentioned above, and other objects which have not been mentioned above will be clearly understood to those skilled in the art from the following description.

According to some example embodiments of the present inventive concepts, an image sensor may comprise: a substrate having a first surface and a second surface that face each other; an isolation pattern that defines a plurality of pixel regions in the substrate; a plurality of contact plugs on the first surface of the substrate and coupled to the isolation pattern; and a plurality of first micro-lens patterns on the second surface of the substrate. The contact plugs may include a first contact plug and a second contact plug that neighbor each other. A portion of the isolation pattern may extend across a first region and a second region in the substrate. The first region may vertically overlap the first contact plug. The second region may vertically overlap the second contact plug.

According to some example embodiments of the present inventive concepts, an image sensor may comprise: a substrate having a pixel array region and a pad region that surrounds the pixel array region in plan view, the pixel array region including a plurality of pixel regions, a pad terminal at the pad region of the substrate and on a second surface of the substrate; a conductive pattern at the pad region of the substrate, the conductive pattern penetrating the substrate and being coupled to the pad terminal; a plurality of micro-lens patterns at the pixel array region of the substrate and on the second surface of the substrate; an isolation pattern in the substrate, the isolation pattern defining the pixel regions; a contact plug at the pixel array region of the substrate and on a first surface of the substrate, the contact plug being coupled to the isolation pattern; and a wiring structure on the first surface of the substrate, the wiring structure being electrically connected to the contact plug and the conductive pattern. The second surface of the substrate may stand opposite the first surface of the substrate.

According to some example embodiments of the present inventive concepts, an image sensor may comprise: a substrate having a pixel array region, an optical black region, and a pad region, the optical black region being provided between the pixel array region and the pad region; a pad terminal at the pad region of the substrate and on a second surface of the substrate; a conductive pattern at the pad region of the substrate, the conductive pattern penetrating the substrate and being coupled to the pad terminal; a light-shield pattern at the optical black region of the substrate and on the second surface of the substrate; a plurality of micro-lens patterns at the pixel array region of the substrate and on the second surface of the substrate; a plurality of color filters at the pixel array region of the substrate and between the second surface of the substrate and the micro-lens patterns; a plurality of photoelectric conversion regions in the substrate and at the pixel array region of the substrate; a first isolation pattern at the pixel array region of the substrate and in the substrate between the photoelectric conversion regions; a second isolation pattern between the first isolation pattern and the substrate; a plurality of contact plugs at the pixel array region of the substrate and on a first surface of the substrate, the contact plugs being coupled to the first isolation pattern; a gate pattern at the pixel array region of the substrate and on the first surface of the substrate; a gate contact plug provided on and coupled to the gate pattern; and a wiring layer on the first surface of the substrate, the wiring layer including a plurality of dielectric layers and a wiring structure. The gate contact plug may be electrically separated from the contact plug. At least one of the contact plugs may be electrically connected to the pad terminal through the wiring structure and the conductive pattern.

BRIEF DESCRIPTION OF THE DRAWINGS

FIG. 2A illustrates a plan view showing an image sensor, according to some example embodiments.

DETAILED DESCRIPTION OF EMBODIMENTS

Figure 1:
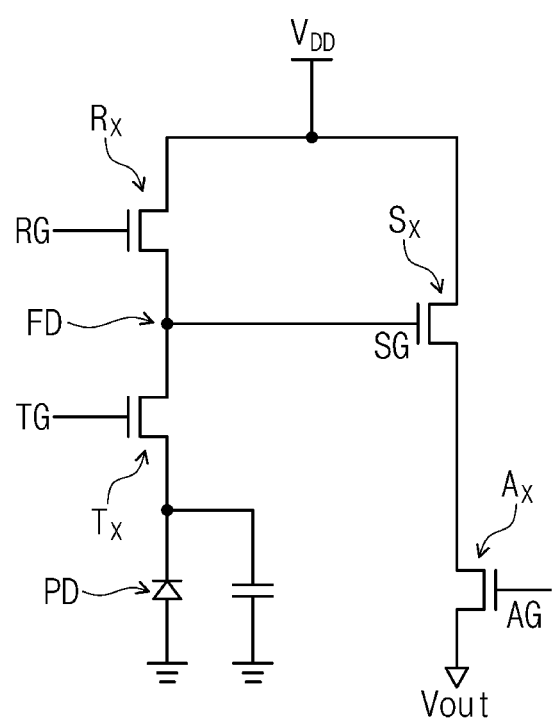
FIG. 1 illustrates a circuit diagram showing a pixel of an image sensor, according to some example embodiments.

In this description, like reference numerals may indicate like components. The following will now describe an image sensor according to some example embodiments of the present inventive concepts.

FIG. 1 illustrates a circuit diagram showing a pixel of an image sensor, according to some example embodiments.

Referring to FIG. 1, each of pixels of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes an n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax.

An operation of the image sensor will be explained below with reference to FIG. 1. First, under a light-blocked state, a power voltage $V_{DD}$ may be applied to a drain of the reset transistor Rx and a drain of the source follower transistor Sx, such that the reset transistor Rx may be turned on to discharge charges that remain on the floating diffusion region FD. Thereafter, when the reset transistor Rx is turned off and external light is incident on the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and hole may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A connection line may be electrically connected to one or more of the transfer gate TG, the source follower gate SG, the reset gate RG, and the selection gate AG. The connection line may be configured to apply the power voltage $V_{DD}$ to the drain of the reset transistor Rx or the drain of the source follower transistor Sx. The connection line may include a column line connected to the selection transistor Ax. The connection line may be a first line pattern or a second line pattern which will be discussed below.

FIG. 1 depicts by way of example a pixel including one photoelectric conversion region PD and four transistors Tx, Rx, Ax, and Sx, but the present inventive concepts are not limited thereto. For example, the pixel may be provided in plural, and neighboring pixels may share one of the reset transistor Rx, the source follower transistor Sx, and the selection transistor Ax. Therefore, the image sensor may increase in integration.

Figure 2B:
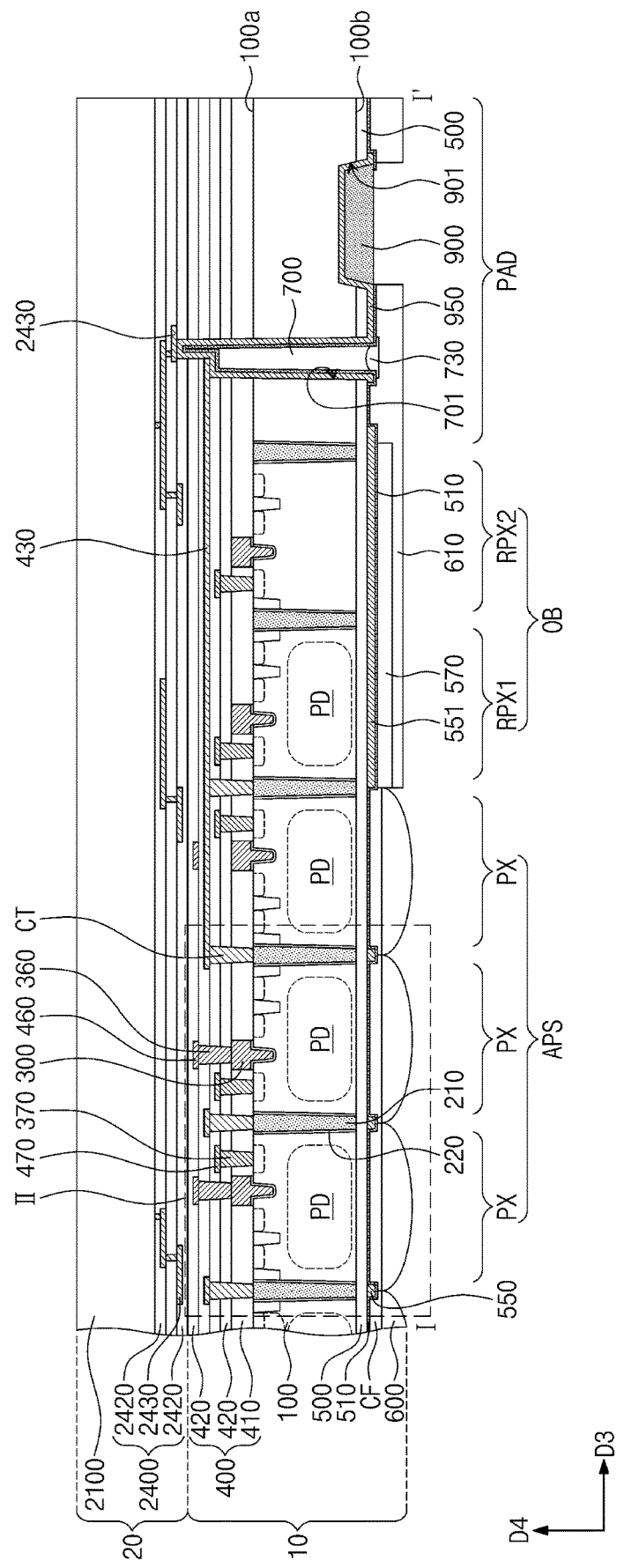
FIG. 2B illustrates a cross-sectional view taken along line I-I' of FIG. 2A.

FIG. 2A illustrates a plan view showing an image sensor, according to some example embodiments. FIG. 2B illustrates a cross-sectional view taken along line I-I' of FIG. 2A.

Referring to FIGS. 2A and 2B, an image sensor may include a sensor chip 10. The sensor chip 1.0 may include a first substrate 100, a first wiring layer 400, a first isolation pattern 210, a second isolation pattern 220, and a contact plug CT.

When viewed in plan, the first substrate 100 may include a pixel array region APS, an optical black region OB, and a pad region PAD. When viewed in plan, the pixel array region APS may be disposed on a central portion of the first substrate 100. The pixel array region APS may include a plurality of pixel regions PX. The pixels discussed with reference to FIG. 1 may be formed on corresponding pixel regions PX of the first substrate 100. For example, components of the pixels may be provided on corresponding pixel regions PX. The pixel regions PX may output photoelectric signals from incident light. The pixel regions PX may be two-dimensionally arranged in rows and columns. The rows may be parallel to a first direction D1. The columns may be parallel to a second direction D2. In this description, the first direction D1 may be parallel to a first surface 100a of the first substrate 100. The second direction D2 may be parallel to the first surface 100a of the first substrate 100 and different from the first direction D1. For example, the second direction D2 may be substantially perpendicular to the first direction D1. A third direction D3 may be parallel to the first surface 100a of the first substrate 100, and may intersect the first direction D1 and the second direction D2. A fourth direction D4 may be substantially perpendicular to the first surface 100a of the first substrate 100.

The pad region PAD may be provided on an edge portion of the first substrate 100 and may surround the pixel array region APS. Pad terminals 900 may be provided on the pad region PAD. The pad terminals 900 may externally output electrical signals generated from the pixel regions PX. Alternatively, external electrical signals or voltages may be transferred through the pad terminals 900 to the pixel regions PX. As the pad region PAD is disposed on the edge portion of the first substrate 100, the pad terminals 900 may be easily coupled to the outside. For brevity of description, the following will discuss a single pad terminal 900. The optical black region OB will be discussed below. With reference to FIGS. 3A to 3D, the following description focuses on the pixel array region APS of the sensor chip 10 in the image sensor.

Figure 3A:
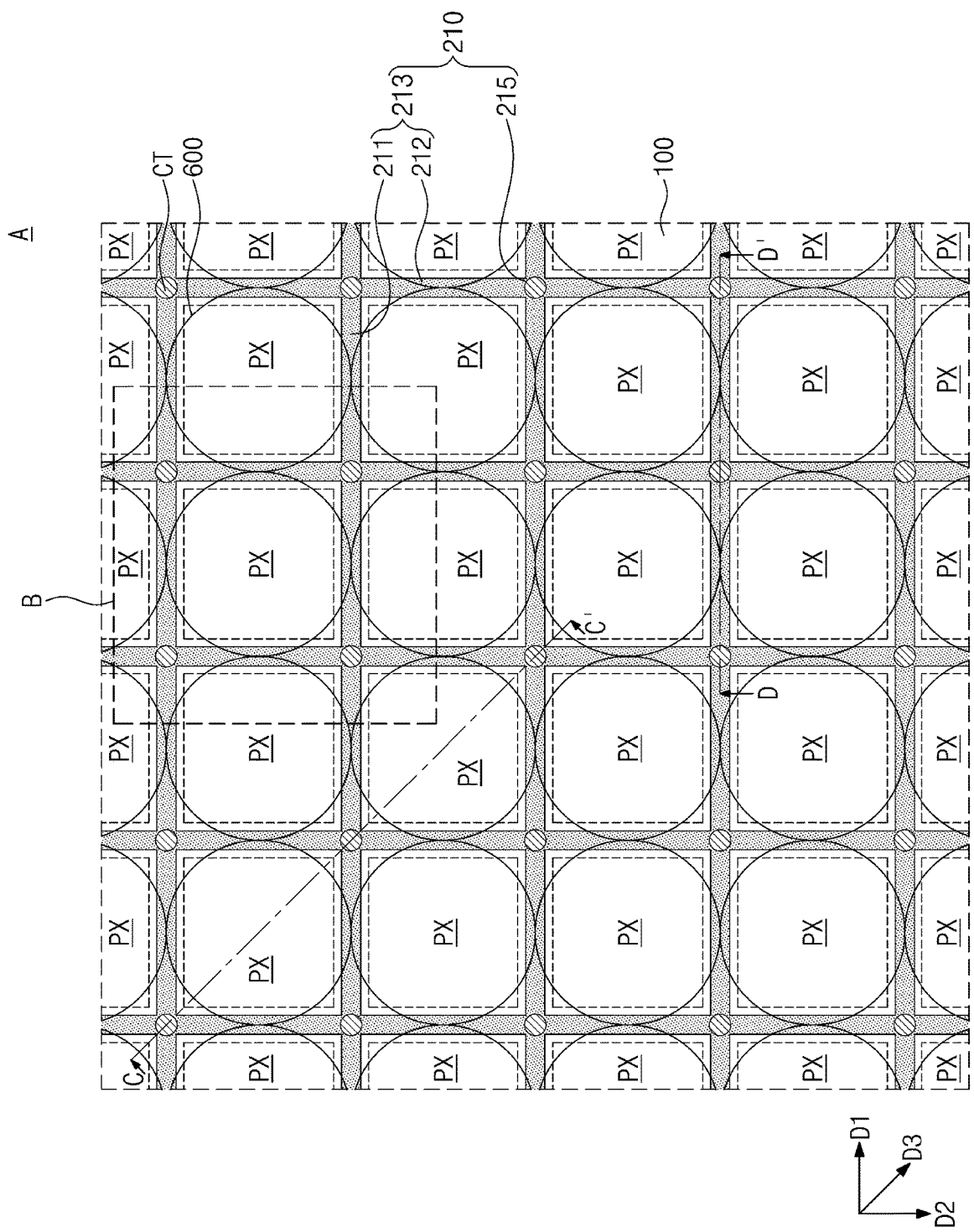
FIG. 3A illustrates an enlarged plan view of section A of FIG. 2A, showing a pixel array region of an image sensor, according to some example embodiments.
Figure 3B:
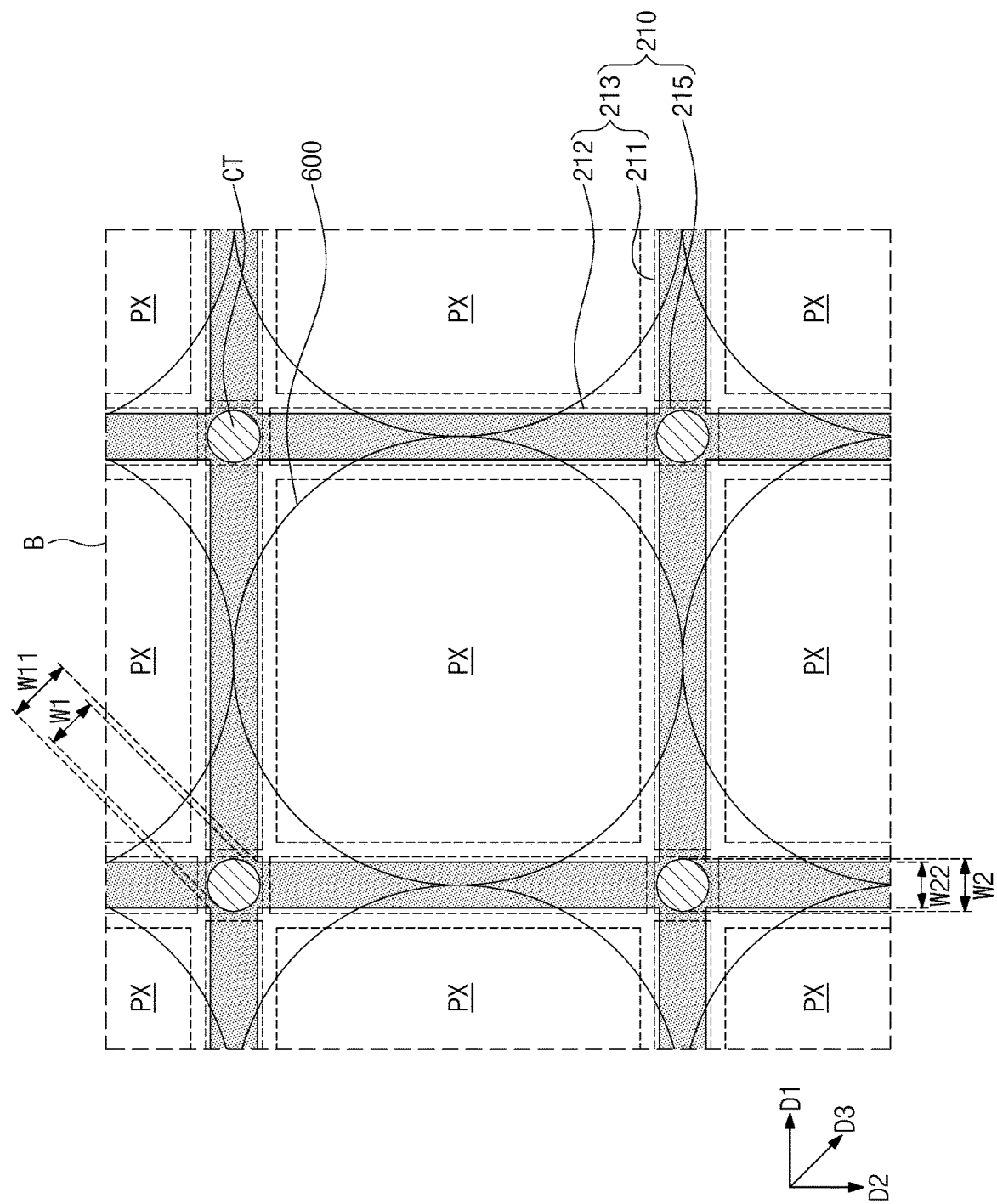
FIG. 3B illustrates an enlarged view showing section B of FIG. 3A.
Figure 3C:
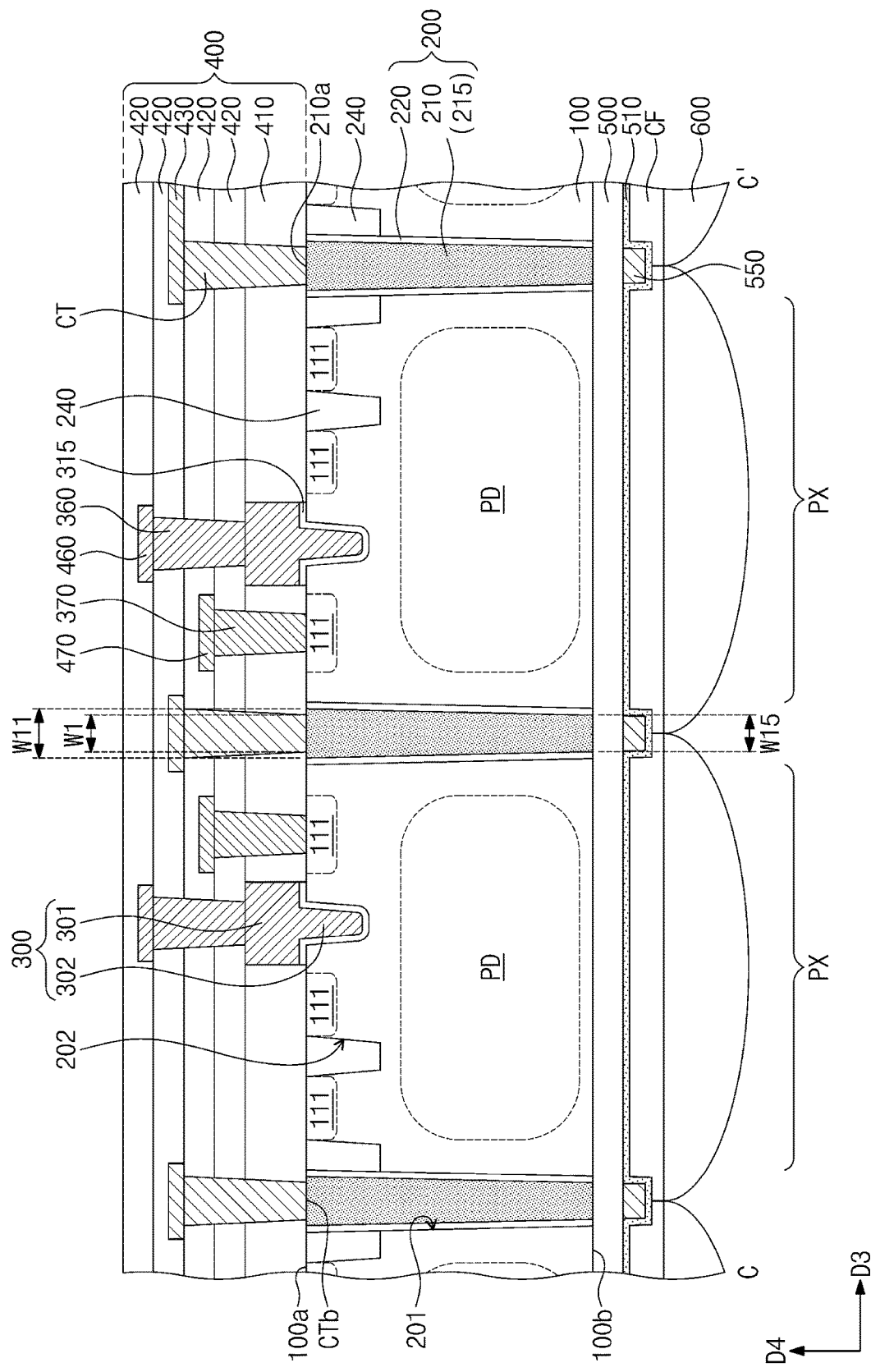
FIG. 3C illustrates a cross-sectional view taken along line C-C' of FIG. 3A.
Figure 3D:
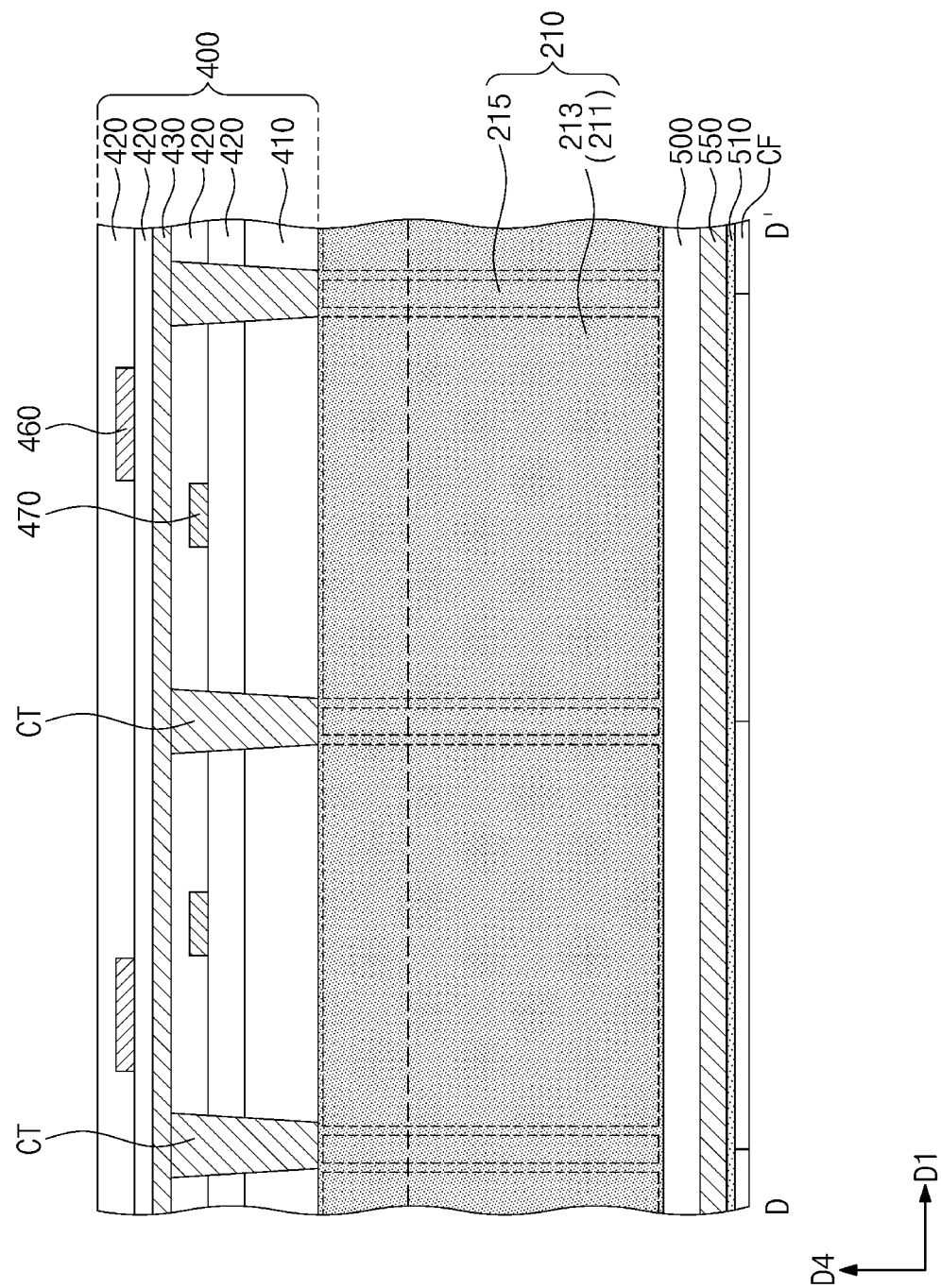
FIG. 3D illustrates a cross-sectional view taken along line D-D' of FIG. 3A.

FIG. 3A illustrates an enlarged plan view of section A of FIG. 2A, showing a pixel array region of an image sensor, according to some example embodiments. FIG. 3B illustrates an enlarged view showing section B of FIG. 3A. FIG. 3C illustrates an enlarged cross-sectional view taken along line C-C' of FIG. 3A, which corresponds to section II of FIG. 2B. FIG. 3D illustrates a cross-sectional view taken along line D-D' of FIG. 3A. FIGS. 2A and 2B will also be referred to in the following description of FIGS. 3A to 3D.

Referring to FIGS. 3A, 3B, 3C, and 3D, an image sensor may include a first substrate 100, a first wiring layer 400, micro-lens patterns 600, color filters CF, first and second isolation patterns 210 and 220, and a contact plug CT.

The first substrate 100 may have a first surface 100a and a second surface 100b that face each other. The first surface 100a of the first substrate 100 may be a front surface, and the second surface 100b of the first substrate 100 may be a rear surface. The first substrate 100 may receive light on the first surface 100a. The first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may include first conductivity type impurities, thereby having a first conductivity type. The first conductivity type impurities may include p-type impurities, such as aluminum (Al), boron (B), indium (In), and/or gallium (Ga).

The first substrate 100 may include photoelectric conversion regions PD. The photoelectric conversion regions PD may be provided on corresponding pixel regions PX in the first substrate 100. The photoelectric conversion regions PD may each have the same function and role as that of the photoelectric conversion region PD shown in FIG. 1. The photoelectric conversion regions PD may be regions where the first substrate 100 is doped with second conductivity type impurities. The second conductivity type impurities may have a conductivity type different from that of the first conductivity type impurities. The second conductivity type impurities may include n-type impurities, such as phosphorus, arsenic, bismuth, and/or antimony. The photoelectric conversion regions PD may be located deep below the first surface 100a of the first substrate 100.

As shown in FIG. 3C, the first substrate 100 may be provided therein with an isolation pattern 200 that defines pixel regions PX. For example, the isolation pattern 200 may be provided between the pixel regions PX of the first substrate 100. The isolation pattern 200 may be provided in a first trench 201, which first trench 201 may be recessed from the first surface 100a of the first substrate 100. In some embodiments, the first trench 201 may extend from the first surface 100a to the second surface 100b. The isolation pattern 200 may be a deep trench isolation (DTI) layer. The isolation pattern 200 may penetrate the second surface 100b of the first substrate 100.

The isolation pattern 200 may include the first isolation pattern 210 and the second isolation pattern 220. The second isolation pattern 220 may be provided along a sidewall of the first trench 201. The second isolation pattern 220 may include, for example, one or more of a silicon-based dielectric material (e.g., silicon nitride, silicon oxide, and/or silicon oxynitride) and a high-k dielectric material (e.g., hafnium oxide and/or aluminum oxide). Alternatively, the second isolation pattern 220 may include a plurality of layers, which layers may include different materials from each other. The second isolation pattern 220 may have a refractive index less than that of the first substrate 100. Accordingly, a crosstalk phenomenon may be prevented or reduced between the pixel regions PX of the first substrate 100.

The first isolation pattern 210 may be provided in the second isolation pattern 220. For example, the second isolation pattern 220 may surround a sidewall of the first isolation pattern 210. The second isolation pattern 220 may be interposed between the first isolation pattern 210 and the first substrate 100. The second isolation pattern 220 may separate the first isolation pattern 210 from the first substrate 100. Therefore, when the image sensor operates, the first isolation pattern 210 may be electrically separated from the first substrate 100. The first isolation pattern 210 may include a crystalline semiconductor material, for example, polysilicon. The first isolation pattern 210 may further include dopants, which dopants may include first conductivity type impurities or second conductivity type impurities. For example, the first isolation pattern 210 may include doped polysilicon. Alternatively, the first isolation pattern 210 may include undoped crystalline semiconductor material. For example, the first isolation pattern 210 may include undoped polysilicon. The term "undoped" may mean that no doping process is intentionally performed. For example, the first isolation pattern 210 may have dopants whose concentration is equal to or less than about $10^{15}$ ions/cm$^3$. The dopants may include n-type dopants or p-type dopants. As shown in FIG. 3C, the first isolation pattern 210 may have at a top surface 210a thereof a width W11 greater than a width W15 at a bottom surface thereof. In this case, the bottom surface of the first isolation pattern 210 may be coplanar with the second. surface 100b of the first substrate 100. The top surface 210a may stand opposite the bottom surface of the first isolation pattern 210. The top surface 210a may be coplanar with the first surface 100a of the first substrate 100. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

As shown in FIG. 3B, when viewed in plan, the first isolation pattern 210 may include a connection portion 213 and intersection portions 215. The connection portion 213 of the first isolation pattern 210 may include first portions 211 and second portions 212. When viewed in plan, each of the first portions 211 may have a major axis parallel to the first direction D1. Each of the second portions 212 may have a major axis parallel to the second direction D2. The intersection portions 215 may be provided at sections where the first portions 211 meet the second portions 212. The connection portion 213 may be provided between and connected to two neighboring intersection portions 215.

As shown in FIG. 3C, the first wiring layer 400 may be disposed on the first surface 100a of the first substrate 100. The first wiring layer 400 may include a first dielectric layer 410, second dielectric layers 420, and a wiring structure 430. The first dielectric layer 410 may cover the first surface 100a of the first substrate 100. The second dielectric layers 420 may be stacked on the first dielectric layer 410. The first and second dielectric layers 410 and 420 may include a silicon-based dielectric material, such as silicon oxide, silicon nitride, and/or silicon oxynitride.

The contact plug CT may be provided on the top surface 210a of the first isolation pattern 210 and in the first dielectric layer 410. The contact plug CT may extend into at least one of the second dielectric layers 420. The contact plug CT may be electrically connected to the first isolation pattern 210 For example, the contact plug CT may be provided in plural, and the plurality of contact plugs CT may be in contact with corresponding intersection portions 215 of the first isolation pattern 210. For example, a bottom surface of each of the plurality of contact plugs CT may contact a top surface of a corresponding one of the intersection portions 215 of the first isolation pattern 210. As shown in FIG. 3B, the contact plugs CT may overlap the intersection portions 215 of the first isolation pattern 210. When viewed in plan, a plurality of contact plugs CT may be disposed to surround each pixel region PX. For example, when viewed in plan, each pixel region PX may have a plurality of corner areas (e.g., four corner areas). The corner areas may correspond to portions where two neighboring lateral surfaces of each pixel region PX meet each other. The contact plugs CT may be correspondingly disposed outside the corner areas of the pixel regions PX. For example, each contact plug CT may be spaced apart from the corner areas of the surrounding pixel regions PX. The contact plugs CT may include a first contact plug CT and a second contact plug CT that are adjacent to each other. The connection portion 213 of the first isolation pattern 210 may extend from the first contact plug CT to the second contact plug CT. For example, the connection portion 213 of the first isolation pattern 210 may extend while running across a first region and a second region in the first substrate 100. The first region may vertically overlap the first contact plug CT, and the second region may vertically overlap the second contact plug CT. For example, referring to FIG. 3B, each of the first portions 211 of the first isolation pattern 210 may extend between two contact plugs CT adjacent in the first direction D1, and each of the second portions 212 of the first isolation pattern 210 may extend between two contact plugs CT adjacent in the second direction D2.

Therefore, the intersection portion 215 coupled to the first contact plug CT may be connected through the connection portion 213 to the intersection portion 215 coupled to the second contact plug CT.

When viewed in plan, a plurality of pixel regions PX may surround each contact plug CT and each intersection portion 215 of the first isolation pattern 210. For example, when viewed in plan, four neighboring pixel regions PX may surround the contact plug CT and the intersection portion 215 of the first isolation pattern 210. Central points of at least four micro-lens patterns 600 may define an imaginary polygon. In this case, the four micro-lens patterns 600 may be adjacent to each other. The contact plug CT and the intersection portion 215 of the first isolation pattern 210 may be disposed in the imaginary polygon. For example, the contact plug CT and the intersection portion 215 of the first isolation pattern 210 may be placed in an area surround by the central points of the four micro-lens patterns 600. In some embodiments, the contact plug CT and the intersection portion 215 of the first isolation pattern 210 may be disposed in the center of the imaginary polygon.

The contact plug CT may include a conductive material, such as metal, For example, the contact plug CT may include tungsten. For another example, the contact plug CT may include copper or aluminum.

As shown in FIG. 3D, the wiring structure 430 may be disposed on and electrically connected to a plurality of contact plugs CT. The wiring structure 430 may include a line portion interposed between two neighboring dielectric layers 410 and 420. Differently from that shown, the wiring structure 430 may further include a via portion. The via portion of the wiring structure 430 may penetrate at least one of the second dielectric layers 420 and may have a connection with the line portion of the wiring structure 430. When the image sensor operates, the wiring structure 430 may be supplied with a first voltage. The first voltage may be, for example, a negative bias voltage. The first voltage may be applied through the contact plugs CT to each of the intersection portions 215 of the first isolation pattern 210. The connection portion 213 may receive the first voltage applied to the intersection portions 215. As the first voltage is applied to the first isolation pattern 210, it may be possible to remove electrons (e.g., noise electrons) generated from interface defects between the first isolation pattern 210 and the first substrate 100. The interface defects may be provided, for example, on the sidewall of the first trench 201. The removal of the interface defects may improve image quality of the image sensor. The wiring structure 430 may include metal, such as copper, tungsten, aluminum, titanium, tantalum, or any alloy thereof.

When the first substrate 100 has a few contact plugs CT or a single contact plug CT on an edge portion thereof, on the pixel array region (see APS of FIG. 2A) of the first substrate 100, the first voltage may be transmitted through the first isolation pattern 210 to a central portion of the pixel array region APS of the first substrate 100. In this description, the central portion of the pixel array region APS may indicate a center of the pixel array region APS when viewed in plan. The edge portion of the first substrate 100 may denote the optical black region OB, the pad region PAD, or an edge portion of the pixel array region APS. The first isolation pattern 210 may include a semiconductor material. The semiconductor material may have resistance greater than that of a conductive material (e.g., metal). As the first voltage is transmitted from the edge portion of the first substrate 100 through the first isolation pattern 210 to the central portion of the pixel array region APS, a RC delay phenomenon of the first voltage may occur at the first isolation pattern 210 on the central portion of the pixel array region APS.

According to some example embodiments, the contact plug CT may be provided in plural, and the plurality of contact plugs CT may be disposed on the central and edge portions of the pixel array region APS. The contact plugs CT may be coupled to corresponding intersection portions 215 of the first isolation pattern 210. Accordingly, the first voltage may be transmitted through the wiring structure 430 to the central portion of the pixel array region APS. As the wiring structure 430 includes a conductive material, the wiring structure 430 may have resistance less than that of the first isolation pattern 210. The first voltage may be directly transmitted from the central portion of the pixel array region APS through the contact plugs CT to the intersection portions 215 of the first isolation pattern 210. The intersection portions 215 may be provided to surround each pixel region PX. Therefore, it may be possible to allow the first voltage to have a reduced pathway through the first isolation pattern 210. It may also possible to avoid the RC delay phenomenon of the first voltage at the central portion of the pixel array region APS. The image sensor may have improved image characteristics.

According to some example embodiments, the reduction in pathway of the first voltage through the first isolation pattern 210 may cause omission of a doping process performed on the first isolation pattern 210. It may be possible to simplify fabrication of the image sensor. Alternatively, the first isolation pattern 210 may include doped crystalline semiconductor material.

A bottom surface of each contact plug CT may have a first width W1 and a second width W2. As shown in FIG. 3B, the second width W2 at the bottom surface CTb of the contact plug CT may be measured in the first direction D1. The second width W2 of the contact plug CT may be substantially the same as the first width W1 of the contact plug CT. The second width W2 may be greater than a width W22 at the second portion 212 of the first isolation pattern 210. The width W22 at the second portion 212 of the first isolation pattern 210 may be a width at a top surface of the second portion 212 of the first isolation pattern 210. The width W22 at the second portion 212 of the first isolation pattern 210 may be a width measured in the first direction D1. As the second width W2 is greater than the width W22 at the second portion 212, when the contact plug CT is disposed on the connection portion 213 of the first isolation pattern 210, a poor electrical connection may he provided between the contact plug CT and the first isolation pattern 210.

As shown in FIGS. 3B and 3C, the first width W1 of the contact plug CT may be less than the width W11 at the top surface 210a of the intersection portion 215 of the first isolation pattern 210. The first width W1 of the contact plug CT and the width W11 at the intersection portion 215 of the contact plug CT may be widths measured in a direction parallel to the third direction D3. The third direction D3 may be a diagonal direction. For example, the third direction D3 may be parallel to diagonal directions of the pixel regions PX. According to some example embodiments, as the contact plug CT is disposed at the intersection portion 215 of the first isolation pattern 210, the bottom surface CTb of the contact plug CT may be in good contact with the top surface 210a of the first isolation pattern 210. For example, the bottom surface CTb of the contact plug CT may not be in contact with the second isolation pattern 220. It may be possible to improve contact properties between the contact plug CT and the first isolation pattern 210 and to accomplish improved image characteristics of the image sensor.

As shown in FIG. 3C, the first substrate 100 may have impurity regions 111. The impurity regions 111 may be disposed on the pixel regions PX in the first substrate 100. The impurity regions 111 may be disposed adjacent to the first surface 100a of the first substrate 100. The impurity regions 111 may have their bottom surfaces spaced apart from the photoelectric conversion regions PD in the fourth direction D4. The impurity regions 111 may be doped with second conductivity type impurities (e.g., n-type impurities). Therefore, the impurity regions 111 may each have a second conductivity type. The impurity regions 111 may be active regions or ground regions. The active regions may mean areas for the operation of a transistor, and may include source/drain regions of a transistor and the floating diffusion region FD discussed with reference to FIG. 1. The transistor may include one of the transfer transistor Tx, the source/follower transistor Sx, the reset transistor Rx, and the selection transistor Ax that are discussed with reference to FIG. 1.

A device dielectric pattern 240 may be provided in the first substrate 100. The device dielectric pattern 240 may define active regions or ground regions. On each of the pixel regions PX, the device dielectric pattern 240 may define the impurity regions 111 and may divide the impurity regions 111 from each other. For example, the device dielectric pattern 240 may be disposed on a side of one of the impurity regions 111 in the first substrate 100. The device dielectric pattern 240 may have a bottom surface provided in the first substrate 100. For example, the device dielectric pattern 240 may be provided in a second trench 202, which second trench 202 may be recessed from the first surface 100a of the first substrate 100. The bottom surface of the device dielectric pattern 240 may be at a lower level than a bottom of the impurity regions 111. The device dielectric pattern 240 may be a shallow trench isolation (STI) layer. For example, an interval between the bottom surface of the device dielectric pattern 240 and the first surface 100a of the first substrate 100 may be less than an interval between the bottom surface of the first isolation pattern 210 and the first surface 100a of the first substrate 100. At least a portion of the device dielectric pattern 240 may be disposed on and connected to an upper sidewall of the second isolation pattern 220. A stepwise structure may be constituted by a sidewall of the second isolation pattern 220 and also by the bottom surface and a sidewall of the device dielectric pattern 240. The device dielectric pattern 240 may include, for example, silicon oxide, silicon nitride, and/or silicon oxynitride.

A gate pattern 300 may be disposed on the first surface 100a of the first substrate 100. The gate pattern 300 may be laterally spaced apart from the contact plug CT. The gate pattern 300 may serve as a gate electrode of one of the transfer transistor Tx, the source follower transistor Sx, the reset transistor Rx, and the selection transistor Ax that are discussed above with reference to FIG. 1. For example, the gate pattern 300 may include one of the transfer gate TG, the source follower gate SG, the reset gate RG, and the selection gate AG. For brevity of description, FIG. 3C depicts a single gate pattern 300 on each pixel region PX, but a plurality of gate patterns 300 may be disposed on each pixel region PX. A single gate pattern 300 will be discussed below for brevity of description.

The gate pattern 300 may have a buried gate structure. For example, the gate pattern 300 may include a first portion 301 and a second portion 302. The first portion 301 of the gate pattern 300 may be disposed on the first surface 100a of the first substrate 100. The second portion 302 of the gate pattern 300 may protrude into the first substrate 100. The second portion 302 of the gate pattern 300 may be connected to the first portion 301 of the gate pattern 300. For example, the first portion 301 and the second portion 302 may be in material continuity with one another. Differently from that shown, the gate pattern 300 may have a planar gate structure. In this case, the gate pattern 300 may not include the second portion 302. The gate pattern 300 may include metal, metal silicide, polysilicon, or any combination thereof. In this case, the polysilicon may include doped polysilicon.

As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures. The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

A gate dielectric pattern 315 may be interposed between the gate pattern 300 and the first substrate 100. The gate dielectric pattern 315 may include, for example, one or more of a silicon-based dielectric material silicon oxide, silicon nitride, and/or silicon oxynitride) and a high-k dielectric material (e.g., hafnium oxide and/or aluminum oxide).

A gate contact plug 360 may be disposed on and coupled to the gate pattern 300. The gate contact plug 360 may penetrate at least one of the second dielectric layers 420. The gate contact plug 360 may include metal such as that discussed in the example of the contact plug CT. The gate contact plug 360 may be laterally spaced apart from the contact plug CT. The gate contact plug 360 may be electrically separated from the contact plug CT.

A conductive plug 370 may be disposed in the first dielectric layer 410 and on the second surface 100b of the first substrate 100, thereby being coupled to one of the impurity regions 111. The conductive plug 370 may penetrate at least one of the second dielectric layers 420. The conductive plug 370 may include metal such as that discussed in the example of the contact plug CT. The conductive plug 370 may be laterally spaced apart from the contact plug CT and the gate contact plug 360. The conductive plug 370 may be electrically separated from the contact plug CT and the gate contact plug 360.

The first wiring layer 400 may further include a first line pattern 460 and a second line pattern 470. The first line pattern 460 may be disposed between the second dielectric layers 420. The first line pattern 460 may be electrically connected to the gate contact plug 360. The first line pattern 460 may be located at a different level from that of the wiring structure 430. For example, the first line pattern 460 may have a bottom surface at a different level from that at which is located a bottom surface of the line portion of the wiring structure 430. The first line pattern 460 may be electrically separated from the wiring structure 430. In this description, a difference in level may be measured in a direction parallel to the fourth direction D4.

The second line pattern 470 may be disposed between the first and second dielectric layers 410 and 420. The second line pattern 470 may be coupled to the conductive plug 370. The second line pattern 470 may be located at a different level from that of the line portion of the wiring structure 430 and that of the first line pattern 460. The second line pattern 470 may be electrically separated from the first line pattern 460 and the wiring structure 430. In this description, the phrase "electrically connected to the first wiring layer 400" may mean "electrically connected to one of the first line pattern 460, the second line pattern 470, and the wiring structure 430".

The image sensor may further include a backside dielectric layer 500. The backside dielectric layer 500 may be disposed on and cover the second surface 100b of the first substrate 100. Although not shown, the backside dielectric layer 500 may include a plurality of layers. Two neighboring layers of the backside dielectric layer 500 may include different materials from each other. For example, the backside dielectric layer 500 may include a metal oxide material (e.g., aluminum oxide or hafnium oxide) or a silicon-based dielectric material (e.g., silicon oxide or silicon nitride). The layers of the backside dielectric layer 500 may have different functions from each other. For example, the backside dielectric layer 500 may include at least one selected from a bottom antireflection coating (BARC) layer, a fixed charge layer, an adhesive layer, and a passivation layer.

The pixel regions PX may include corresponding color filters CF disposed on a bottom surface of the backside dielectric layer 500. Alternatively, the color filters CF may be buried in the backside dielectric layer 500. Each of the color filters CF may include one of red, blue, and green filters. The color filters CF may have therebetween a grid pattern 550 disposed on the bottom surface of the backside dielectric layer 500.

The micro-lens patterns 600 may be disposed on the second surface 100b of the first substrate 100. For example, the micro-lens patterns 600 may be disposed on corresponding bottom surfaces of the color filters CF. The micro-lens patterns 600 may vertically overlap corresponding photoelectric conversion regions PD. In this description, the term "vertically" may mean that "parallel to either the fourth direction D4 or a direction opposite to the fourth direction D4". Each of the micro-lens patterns 600 may protrude away from the second surface 100b of the first substrate 100. Differently from that shown, the micro-lens patterns 600 may be connected to each other. The micro-lens patterns 600 may be transparent to allow light to pass therethrough. The micro-lens patterns 600 may include an organic material, such as a polymer. For example, the micro-lens patterns 600 may include a photoresist material or a thermosetting resin.

The image sensor may further include a protective layer 510. The protective layer 510 may be interposed between the backside dielectric layer 500 and the color filters CF and between the grid pattern 550 and the color filters CF. The protective layer 510 may include a dielectric material, such as a high-k dielectric material. For example, the protective layer 510 may include aluminum oxide or hafnium oxide.

Referring back to FIGS. 2A and 2B, the image sensor may further include a circuit chip 20. The circuit chip 20 may be stacked on the sensor chip 10. The circuit chip 20 may include a second wiring layer 2400 and a second substrate 2100. The second wiring layer 2400 may be interposed between the first wiring layer 400 and the second substrate 2100. Although not shown, integrated circuits may be disposed on a bottom surface of the second substrate 2100 or in the second substrate 2100. The integrated circuits may include logic circuits, memory circuits, or any combination thereof. The integrated circuits may include, for example, transistors. The second wiring layer 2400 may include third dielectric layers 2420 and third line patterns 2430. The third line patterns 2430 may be provided between or in the third dielectric layers 2420. The third line patterns 2430 may be electrically connected to the integrated circuits. The second wiring layer 2400 may further include one or more via patterns, which via patterns may be disposed in the third dielectric layers 2420 and coupled to the third line patterns 2430. The following will discuss a single third line pattern 2430 for brevity of description.

The first wiring layer 400 may be provided on the pixel array region APS, the optical black region OB, and the pad region PAD of the first substrate 100, and may cover the first surface 100a of the first substrate 100.

The pad terminal 900 may be disposed on the pad region PAD of the first substrate 100. The pad terminal 900 may be disposed on the second surface 100b of the first substrate 100. The pad terminal 900 may be buried in the first substrate 100. For example, a pad trench 901 may be provided on the second surface 100b on the pad region PAD of the first substrate 100, and the pad terminal 900 may be provided in the pad trench 901. The pad terminal 900 may include metal, such as aluminum, copper, tungsten, titanium, tantalum, or any alloy thereof. The pad terminal 900 may be electrically connected through a connection structure to an external device. For example, the connection structure may include a bonding wire. In a mounting process of the image sensor, the bonding wire may be formed. on and coupled to the pad terminal 900.

A through hole 701 may penetrate the first and second surfaces 100a and 100b of the first substrate 100. The through hole 701 may further penetrate at least a portion of the first wiring layer 400 or at least a portion of the second wiring layer 2400. The through hole 701 may have a first bottom surface and a second bottom surface. The first bottom surface of the through hole 701 may correspond to a bottom surface of the wiring structure 430. The second bottom surface of the through hole 701 may be located at a different level from that of the first bottom surface of the through hole 701. The second bottom surface of the through hole 701 may correspond to a bottom surface of the third line pattern 2430.

A conductive pattern 950 may be provided on the pad region PAD of the first substrate 100. On the pad region PAD of the first substrate 100, the conductive pattern 950 may be disposed on the second surface 100b of the first substrate 100. The conductive pattern 950 may extend into the pad trench 901 and may intervene between the pad terminal 900 and the first substrate 100. The conductive pattern 950 may be electrically connected to the pad terminal 900.

The conductive pattern 950 may extend into the through hole 701 and may cover a sidewall of the through hole 701. The conductive pattern 950 may cover the first bottom surface of the through hole 701 to come into contact the bottom surface of the wiring structure 430. Therefore, the wiring structure 430 may be electrically connected through the conductive pattern 950 to the pad terminal 900. Accordingly, when the image sensor operates, the first voltage may be applied to the first isolation pattern 210 through the pad terminal 900, the conductive pattern 950, the wiring structure 430, and the contact plug CT.

The conductive pattern 950 may cover the second bottom surface of the through hole 701 to come into contact the bottom surface of the third line pattern 2430. The integrated circuits in the circuit chip 20 may have be electrically connected to the pad terminal 900 through the third line pattern 2430 and the conductive pattern 950. Although not shown, each of the conductive pattern 950 and the through hole 701 may be provided in plural. In this case, one of the conductive patterns 950 may be coupled to either the second line pattern 470 or the first line pattern 460 without being coupled to the wiring structure 430. The one of the conductive patterns 950 may serve as an electrical pathway between a transistor of the circuit chip 20 and a transistor of the sensor chip 10. The conductive pattern 950 may include metal, such as copper, tungsten, aluminum, titanium, tantalum, or any alloy thereof.

The protective layer 510 may extend toward the pad region PAD and the optical black region OB of the first substrate 100. On the pad region PAD of the first substrate 100, the protective layer 510 may be provided in the through hole 701 and on the second surface 100b of the first substrate 100, while covering the conductive pattern 950. For example, the protective layer 510 may cover a bottom surface of the conductive pattern 950. The protective layer 510 may expose the pad terminal 900.

The through hole 701 may be provided therein with a. buried pattern 700 that covers the protective layer 510. The buried pattern 700 may not extend onto the second surface 100b of the first substrate 100. The buried pattern 700 may include a dielectric material. For example, the buried pattern 700 may include a polymer. A bottom surface of the buried pattern 700 may have a recession. For example, the bottom surface of the buried pattern 700 may have a central portion located at a higher level than that of an edge portion of the bottom surface of the buried pattern 700.

A capping pattern 730 may be disposed on the bottom s face of the buried pattern 700. A bottom surface of the capping pattern 730 may be substantially flat or planar. The capping pattern 730 may include a dielectric polymer, such as a photoresist material.

The optical black region OB may be interposed between the pixel array region APS and the pad region PAD. For example, the pad region PAD may surround the optical black region OB, and the optical black region OB may surround the pixel array region APS. The optical black region OB may include a first reference pixel region RPX1 and a second reference pixel region RPX2. The first reference pixel region RPX1 may be disposed between the second reference pixel region RPX2 and the pixel array region APS, and the second reference pixel region RPX2 may be disposed between the first reference pixel region RPX1 and the pad region PAD. On the optical black region OB, the photoelectric conversion region PD may be provided on the first reference pixel region RPX1. The photoelectric conversion region PD on the first reference pixel region RPX1 may have a planar area and a volume the same as those of each of the photoelectric conversion regions PD on the pixel regions PX. The photoelectric conversion region PD may not be provided on the second reference pixel region RPX2. The impurity regions 111, the gate pattern 300, and the device dielectric pattern 240 may be disposed on each of the first and second reference pixel regions RPX1 and RPX2. The impurity regions 111, the gate pattern 300, and the device dielectric pattern 240 may be the same as those discussed with reference to FIG. 3B.

A light-shield layer 551 may be disposed on the optical black region OB on the first surface 100a of the first substrate 100. The light-shield layer 551 may cover the bottom surface of the backside dielectric layer 500. The light-shield layer 551 may not allow light to enter the photoelectric conversion region PD on the optical black region OB. Therefore, pixels of the first and second reference pixel regions RPX1 and RPX2 on the optical black region OB may output noise signals without outputting photoelectric signals. The noise signals may be generated from electrons produced by heat or dark current. The light-shield layer 551 may not cover the pixel array region APS, and thus light may be incident on the photoelectric conversion regions PD on the pixel array region APS. The noise signals may be removed from photoelectric signals that are output from the pixel regions PX. The light-shield layer 551 may include metal, such as tungsten, copper, aluminum, titanium, tantalum, or any alloy thereof. For example, the light-shield layer 551 may include the same material as that of the conductive pattern 950. On the optical black region OB of the first substrate 100, the protective layer 510 may be disposed on a bottom surface of the light-shield layer 551. For example, the protective layer 510 may contact the bottom surface of the light-shield layer 551.

A filtering layer 570 may further be disposed on the second surface 100b on the optical black region OB. The filtering layer 570 may cover a bottom surface of the protective layer 510. For example, the filtering layer 570 may contact the bottom surface of the protective layer 510. The filtering layer 570 may block light whose wavelength is different from that of light of the color filters CF. For example, the filtering layer 570 may block an infrared ray. The filtering layer 570 may include a blue color filter, but the present inventive concepts are not limited thereto.

The optical black region OB may include an organic layer 610 disposed on a bottom surface of the filtering layer 570. The organic layer 610 may contact the bottom surface of the filtering layer 570. The organic layer 610 may be transparent. The organic layer 610 may have a substantially flat bottom surface that stands opposite the first substrate 100. The organic layer 610 may include, for example, a polymer. The organic layer 610 may have dielectric characteristics. Differently from that shown, the organic layer 610 may be connected to the micro-lens patterns 600. In this case, the organic layer 610 may include the same material as that of the micro-lens patterns 600.

The organic layer 610 may further be provided on the pad region PAD of the first substrate 100. The organic layer 610 may cover the capping pattern 730 and a portion of the protective layer 510. For example, the organic layer 610 may contact the capping pattern 730 and the portion of the protective layer 510. The organic layer 610 may expose a bottom surface of the pad terminal 900.

In this description, the phrase "disposed on the first surface 100a of the first substrate 100" may include a meaning that "disposed on one surface of a certain component provided in the first substrate 100", and in this case, the one surface of the certain component may be directed toward the first surface 100a or located at a level the same as or similar to that of the first surface 100a. For example, the description "disposed on the top surface 210a of the first isolation pattern 210" may be interpreted as "disposed on the first surface 100a of the first substrate 100".

Figure 4A:
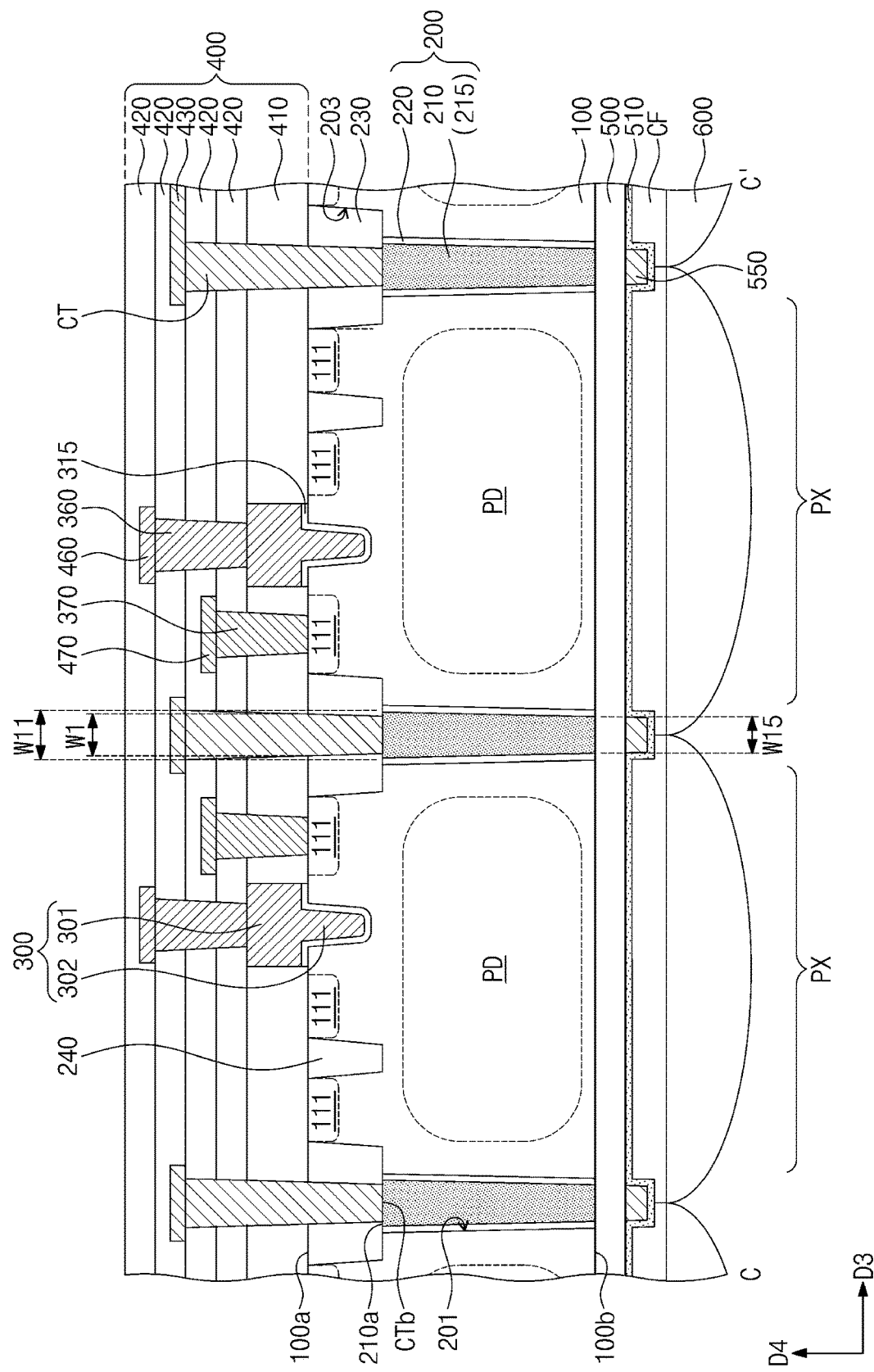
FIG. 4A illustrates a cross-sectional view taken along lime C-C' of FIG. 3A, showing a pixel array region of an image sensor, according to some example embodiments.
Figure 4B:
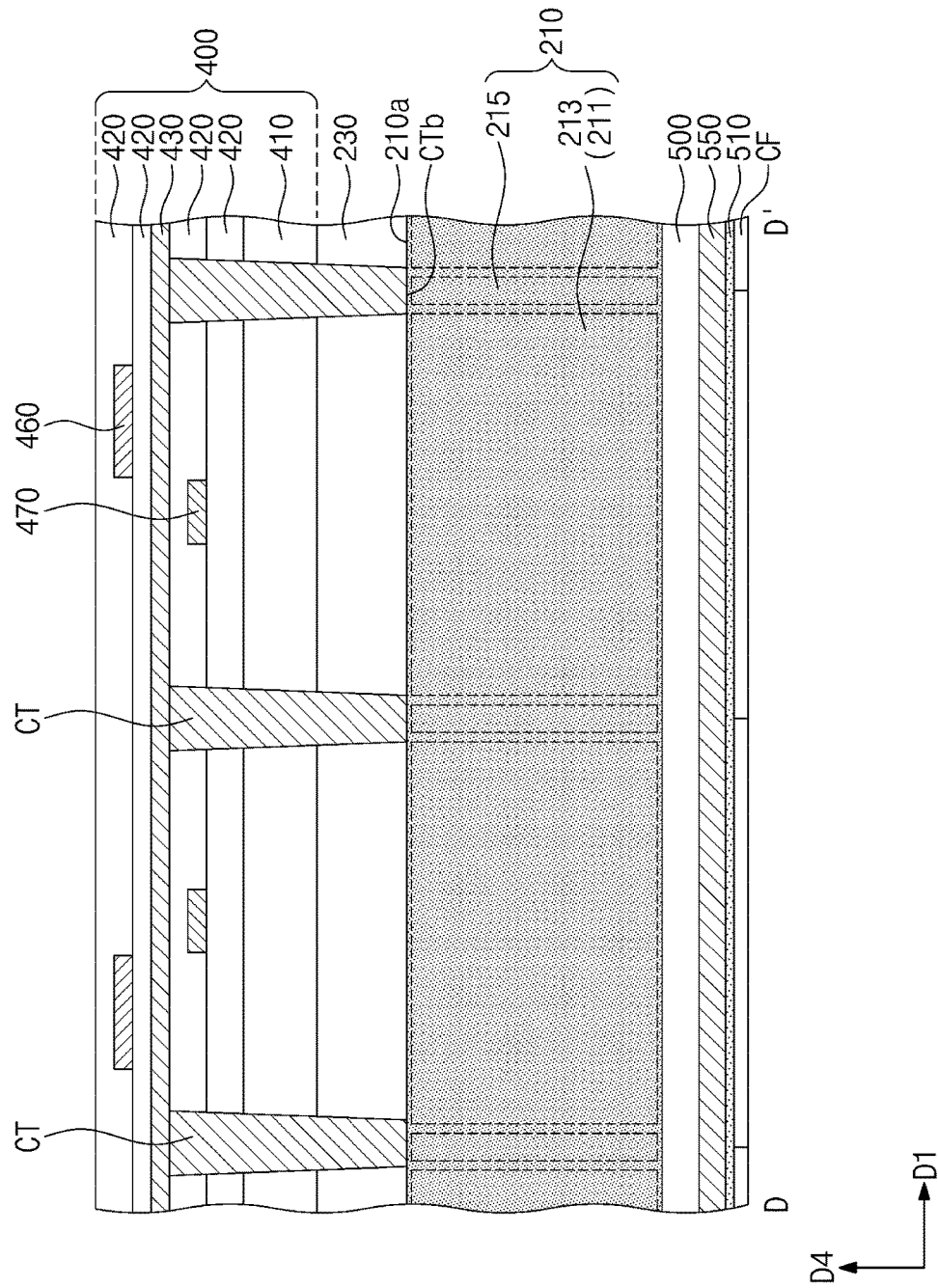
FIG. 4B illustrates a cross-sectional view taken along line D-D' of FIG. 3A, showing a pixel array region of an image sensor, according to some example embodiments.

FIG. 4A illustrates an enlarged cross-sectional view taken along line C-C' of FIG. 3A and corresponding to section II of FIG. 2B, showing a pixel array region of an image sensor according to some example embodiments. FIG. 4B illustrates a cross-sectional view taken along line D-D' of FIG. 3A. FIGS. 3A and 3B will also be referred to in the following description of FIGS. 4A and 4B.

Referring to FIGS. 4A and 4B, an image sensor may further include a third isolation pattern 230 in addition to the first substrate 100, the first wiring layer 400, the micro-lens patterns 600, the color filters CF, the first and second isolation patterns 210 and 220, and the contact plug CT.

The third isolation pattern 230 may be provided in the first substrate 100. For example, the third isolation pattern 230 may include a silicon-based dielectric material that fills a third trench 203. The third trench 203 may be recessed from the first surface 100a of the first substrate 100. The third isolation pattern 230 may be provided on a top surface of the second isolation pattern 220 and the top surface 210a of the first isolation pattern 210, contacting the top surface of the second isolation pattern 220 and the top surface 210a of the first isolation pattern 210. Therefore, the top surface 210a of the first isolation pattern 210 and the top surface of the second isolation pattern 220 may be located at a lower level than that of the first surface 100a of the first substrate 100.

The contact plug CT may penetrate the third isolation pattern 230 and the first dielectric layer 410, and may he coupled to the top surface 210a, of the first isolation pattern 210. The bottom surface CTb of the contact plug CT may be in contact with the intersection portion 215 of first isolation pattern 210. The bottom surface CTb of the contact plug CT may be located at a lower level than that of the first surface 100a of the first substrate 100. A planar arrangement and width of the contact plug CT may be substantially the same as that discussed with reference to FIGS. 3A to 3D.

Figure 5A:
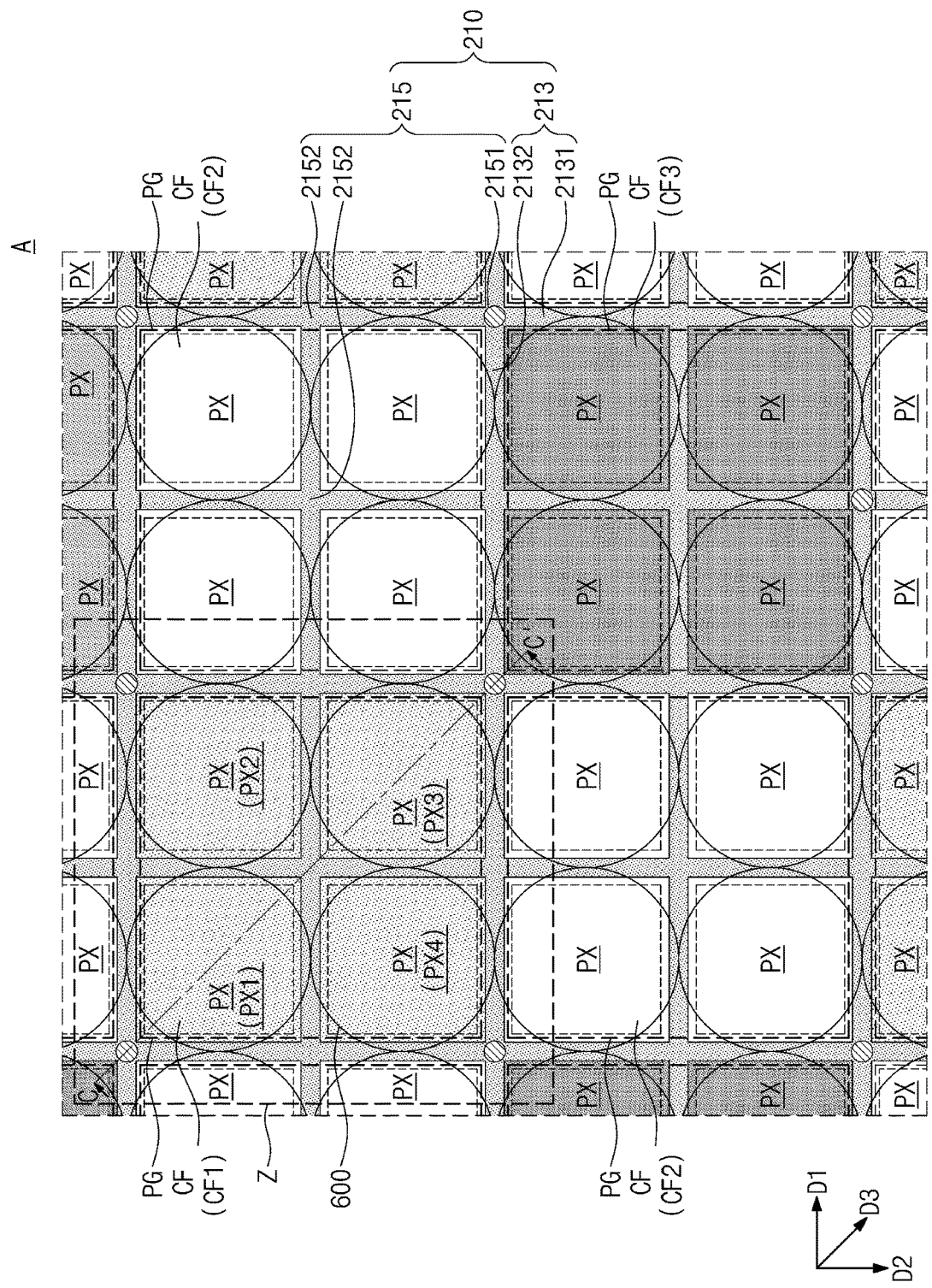
FIG. 5A illustrates a plan view showing a pixel array region of an image sensor, according to some example embodiments.
Figure 5B:
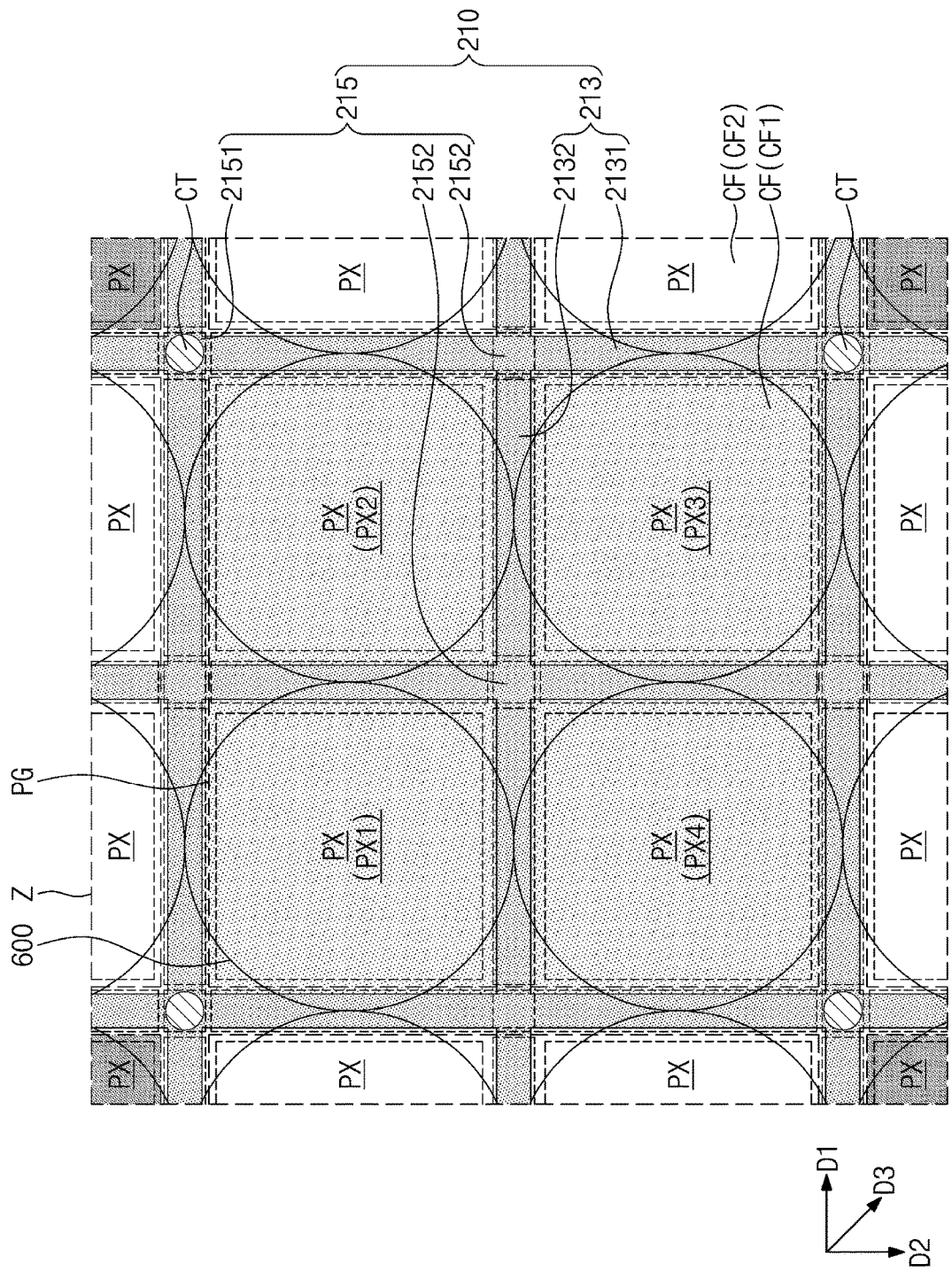
FIG. 5B illustrates an enlarged view showing section Z of FIG. 5A.
Figure 5C:
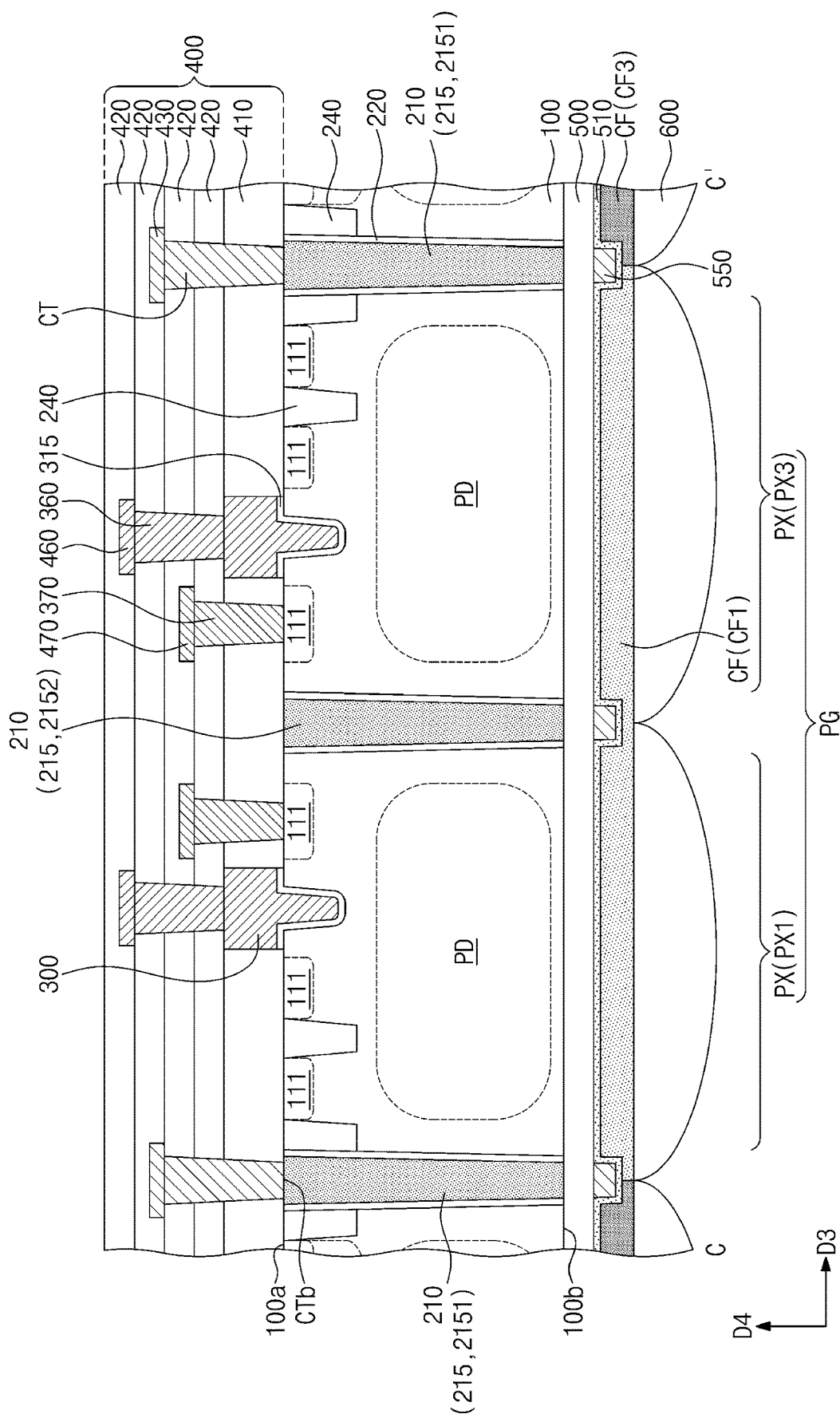
FIG. 5C illustrates a cross-sectional view taken along line C-C' of FIG. 5A.

FIG. 5A illustrates an enlarged plan view of section A of FIG. 2A, showing a pixel array region of an image sensor according to some example embodiments. FIG. 5B illustrates an enlarged view showing section Z of FIG. 5A. FIG. 5C illustrates an enlarged cross-sectional view taken along line C-C' of FIG. 5A, showing section II of FIG. 2B. Duplicate descriptions will be omitted below.

Referring to FIGS. 5A, 5B, and 5C, an image sensor may include the first substrate 100, the first wiring layer 400, the micro-lens patterns 600, the color filters CF, the first and second isolation patterns 210 and 220, and the contact plug CT.

The pixel array region (see APS of FIG. 2A) of the first substrate 100 may include pixel groups PG. As shown in FIG. 5A, when viewed in plan, the pixel groups PG may be two-dimensionally arranged along rows and columns. Each of the pixel groups PG may include a plurality of pixel regions PX. For example, the pixel regions PX of the pixel group PG may include a first pixel region PX1, a second pixel region PX2, a third pixel region PX3, and a fourth pixel region PX4. The first, second, third, and fourth pixel regions PX1, PX2, PX3, and PX4 may be two-dimensionally arranged in two rows and two columns.

The color filters CF may be disposed on the second surface 100b of the first substrate 100 on each of the pixel groups PG. The color filters CF may include a first color filter CF1, a second color filter CF2, and a third color filter CF3. The color filters CF may be substantially the same as the color filters CF discussed above in the example of FIGS. 3A to 3D. For example, the first color filter CF1, the second color filter CF2, and the third color filter CF3 may each include a corresponding one of red, blue, and green filters. In contrast, a single color filter CF may be provided on the first, second, third, and fourth pixel regions PX1 PX2, PX3, and PX4. The single color filter CF may vertically overlap the photoelectric conversion regions PD of the first, second, third, and fourth pixel regions PX1, PX2, PX3, and PX4. The first, second, third, and fourth pixel regions PX1, PX2, PX3, and PX4 may share the single color filter CF. For example, the first color filter CF1 may be provided on the first, second, third, and fourth pixel regions PX1, PX2, PX3, and PX4. The second color filter CF2 may be disposed on the pixel regions PX of one pixel group PG. The third color filter CF3 may be disposed on the pixel regions PX of another pixel group PG. Accordingly, the image sensor may have a tetra-cell structure.

Differently from that shown, the image sensor may have a nona-cell structure. In this case, each of the pixel groups PG may include nine pixel regions PX. The nine pixel regions PX may be two-dimensionally arranged in three rows and three columns. The color filters CF may be provided on corresponding pixel groups PG. For example, a single color filter CF may be provided on the nine pixel regions PX, and may vertically overlap the photoelectric conversion regions PD of the nine pixel regions PX. However, the number of the pixel regions PX included in each of the pixel groups PG may be variously changed.

As shown in FIG. 5B, the first isolation pattern 210 may include a connection portion 213 and an intersection portion 215. The connection portion 213 and the intersection portion 215 may be substantially the same as those discussed above with reference to FIGS. 3A to 3D. In contrast, the connection portion 213 may include first interconnection portions 2131 and second interconnection portions 2132. Each of the first interconnection portions 2131 may be interposed between the pixel groups PG. None of the first interconnection portions 2131 may extend into the pixel group PG. The second interconnection portions 2132 may be provided between the pixel regions PX in each pixel group PG. For example, each of the second interconnection portions 2132 may be interposed between two of the first, second, third, and fourth pixel regions PX1, PX2, PX3, and PX4 in a corresponding pixel group PG.

The intersection portion 215 of the first isolation pattern 210 may include first intersection portions 2151 and a second intersection portion 2152. When viewed in plan, each of the first intersection portions 2151 may be surrounded by four neighboring pixel groups PG. The first intersection portions 2151 may be correspondingly disposed outside corner portions of the pixel groups PG. Each of the first intersection portions 2151 may be provided between and connected to the first interconnection portions 2131. For example, each of the first intersection portions 2151 may be connected to four first interconnection portions 2131. Each of the first intersection portions 2151 may not be directly connected to the second interconnection portion 2132.

The second intersection portion 2152 may be provided between and connected to the second interconnection portions 2132. In this case, the second intersection portion 2152 may be provided on one of the pixel groups PG. Alternatively, the second intersection portion 2152 may be provided between and connected to the first and second interconnection portions 2131 and 2132. The second intersection portion 2152 may be provided in plural.

A plurality of contact plugs CT may be correspondingly provided on and coupled to a plurality of first intersection portions 2151. Each contact plug CT may be disposed outside a corner portion of the pixel group PG. When viewed in plan, each contact plug CT may be surrounded by four neighboring pixel groups PG. The contact plug CT may not be disposed on the second intersection portion 2152.

The previous description may be substantially identically applicable to the first substrate 100, the first wiring layer 400, the second isolation pattern 220, the gate pattern 300, the gate contact plug 360, the conductive plug 370, the backside dielectric layer 500, the grid pattern 550, the protective layer 510, and the micro-lens patterns 600.

Figure 6A:
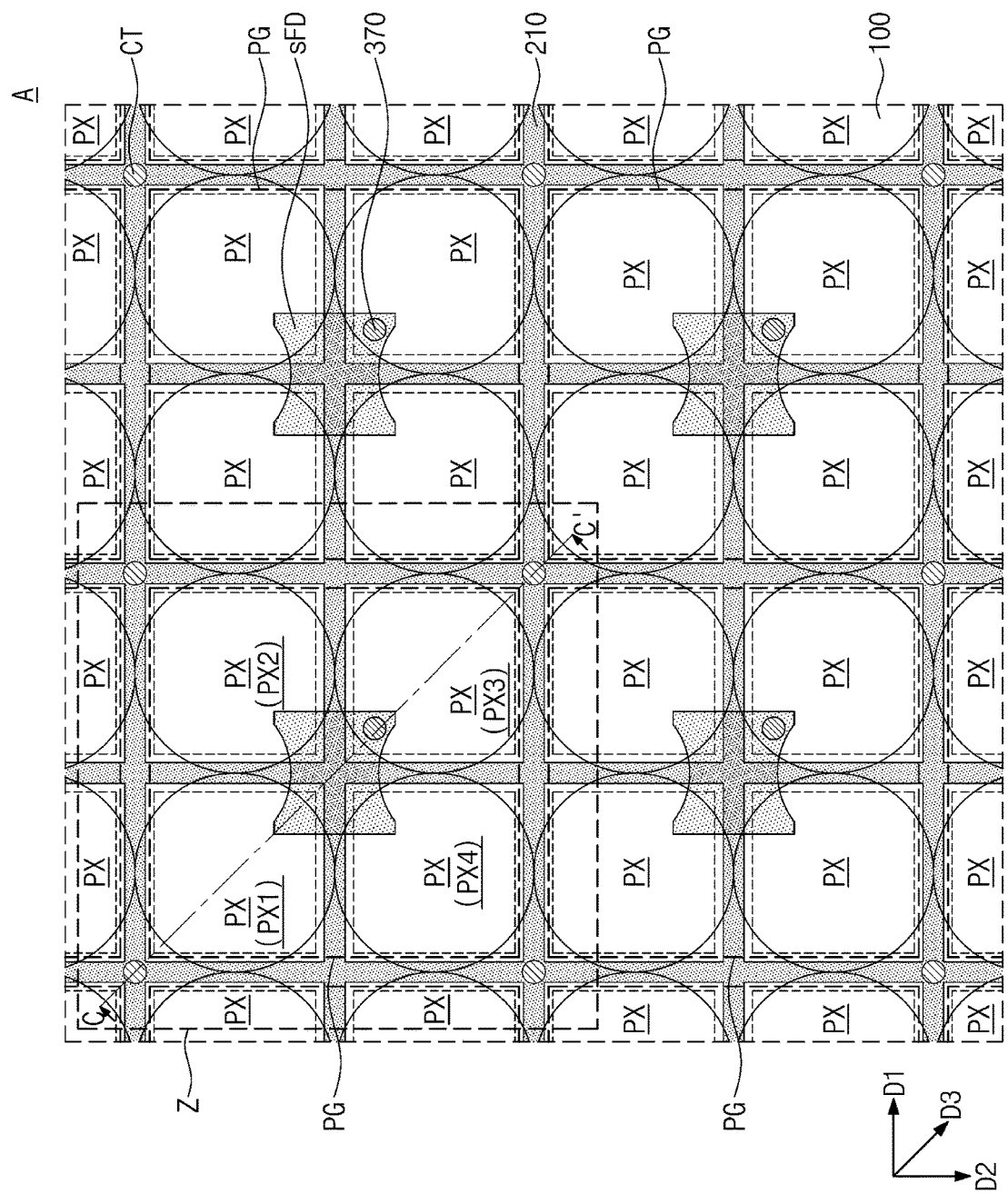
FIG. 6A illustrates a plan view showing a pixel array region of an image sensor, according to some example embodiments.
Figure 6B:
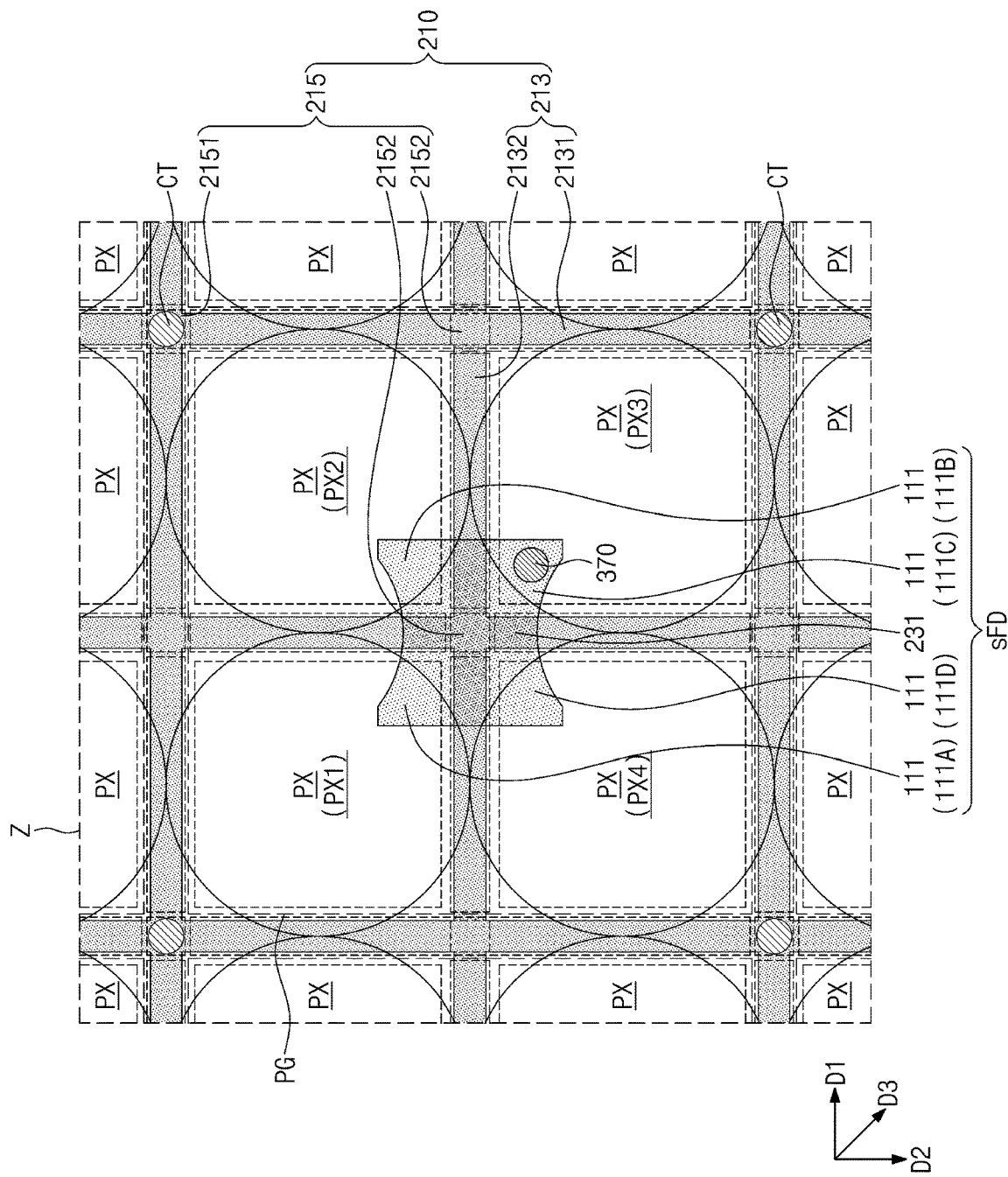
FIG. 6B illustrates an enlarged view showing section Z of FIG. 6A.
Figure 6C:
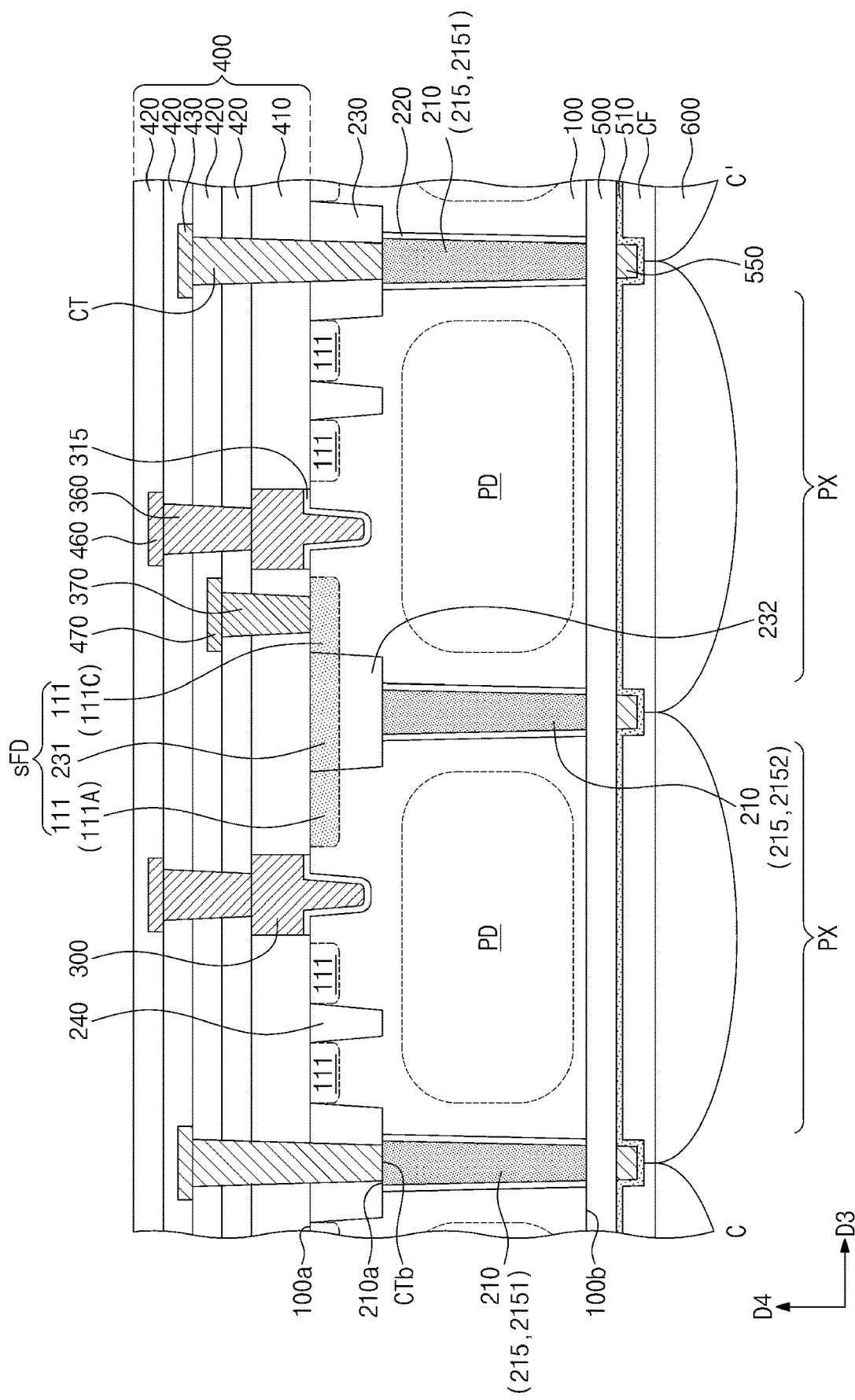
FIG. 6C illustrates a cross-sectional view taken along line C-C' of FIG. 6A.

FIG. 6A illustrates an enlarged plan view of section A of FIG. 2A, showing a pixel array region of an image sensor according to some example embodiments. FIG. 6B illustrates an enlarged view showing section Z of FIG. 6A. FIG. 6C illustrates an enlarged cross-sectional view taken along line C-C' of FIG. 6A, showing section II of FIG. 2B. Duplicate descriptions will be omitted below.

Referring to FIGS. 6A, 6B, and 6C, an image sensor may include the first substrate 100, the first wiring layer 400, the micro-lens patterns 600, the color filters CF, the first and second isolation patterns 210 and 220, and the contact plug CT.

The pixel regions PX of the pixel group PG may include a first pixel region PX1, a second pixel region PX2, a third pixel region PX3, and a fourth pixel region PX4. The first, second, third, and fourth pixel regions PX1 PX2, PX3, and PX4 may be two-dimensionally arranged in two rows and two columns.

The impurity regions 111 may include a first impurity region 111A, a second impurity region 111B, a third impurity region 111C, and a fourth impurity region 111D. The first impurity region 111A, the second impurity region 111B, the third impurity region 111C, and the fourth impurity region 111D may be respectively provided on the first pixel region PX1, the second pixel region PX2, the third pixel region PX3, and the fourth pixel region PX4. The first, second, third, and fourth impurity regions 111A, 111B, 111C, and 111D may include second conductivity type impurities (e.g., n-type impurities). The first, second, third, and fourth impurity regions 111A, 111B, 111C, and 111D may include the same element as dopants.

A third isolation pattern 230 may further be provided on the top surface of the second isolation pattern 220 and the top surface 210a of the first isolation pattern 210. The third isolation pattern 230 may be substantially the same as that discussed in the example of FIGS. 4A and 4B. In contrast, the third isolation pattern 230 may include a doped portion 231 and a dielectric portion 232. The dielectric portion 232 may be an undoped portion. The dielectric portion 232 may be interposed between the doped portion 231 and the first isolation pattern 210. Therefore, the doped portion 231 may be electrically separated from the first isolation pattern 210.

The doped portion 231 may include impurities whose conductivity type is the same as that of the first, second, third, and fourth impurity regions 111A, 111B, 111C, and 111D. For example, the doped portion 231 may be doped to have a second conductivity type. For example, a single process may be employed to dope the doped portion 231 and the first, second, third, and fourth impurity regions 111A, 111B, 111C, and 111D. The doped portion 231 may be implanted with dopants including the same element as that of dopants implanted in the first, second, third, and fourth impurity regions 111A, 111B, 111C, and 111D.

When viewed in plan, the doped portion 231 may be provided on a central portion of each pixel group PG. On the first isolation pattern 210, the doped portion 231 may vertically overlap one of the second intersection portions 2152. The doped portion 231 may not be provided on the first intersection portion 2151. The doped portion 231 may be provided in an imaginary polygon defined by central points of the first, second, third, and fourth pixel regions PX1, PX2, PX3, and PX4. When viewed in plan, the doped portion 231 may be provided between the first and second impurity regions 111A and 111B, between the first and third impurity regions 111A and 111C, between the first and fourth impurity regions 111A and 111D, between the second and fourth impurity regions 111B and 111D, and between the third and fourth impurity regions 111C and 111D. The doped portion 231 may be electrically connected to the first, second, third, and fourth impurity regions 111A, 111B, 111C, and 111D. Therefore, the first, second, third, and fourth impurity regions 111A, 111B, 111C, and 111D may be electrically connected to each other through the doped portion 231, thereby constituting a shared floating diffusion region sFD. The shared floating diffusion region sFD may include the doped portion 231 and the first, second, third, and fourth impurity regions 111A, 111B, 111C, and 111D. The shared floating diffusion region sFD may serve as the floating diffusion region FD discussed with reference to FIG. 1. In contrast, the first, second, third, and fourth pixel regions PX1, PX2, PX3, and PX4 may share the shared floating diffusion region sFD.

A single conductive plug 370 may be disposed on and coupled to the shared floating diffusion region sFD. The presence of the shared floating diffusion region sFD may allow the image sensor to have a compact size. On each of the first, second, third, and fourth pixel regions PX1 PX2, PX3, and PX4, the gate pattern 300 may be disposed close to the shared floating diffusion region sFD, and may serve as the transfer gate TG discussed with reference to FIG. 1.

The first intersection portions 2151, the second intersection portions 2152, the first interconnection portions 2131, and the second interconnection portions 2132 of the first isolation pattern 210 may be substantially the same as those discussed with reference to FIGS. 5A to 5C.

The contact plugs CT may be provided on and coupled to corresponding first intersection portions 2151. For example, the contact plugs CT may extend into the third isolation pattern 230. Differently from that shown, the third isolation pattern 230 may not be provided on the first intersection portion 2151. In this case, the first intersection portions 2151 may have their top surfaces at substantially the same level as that of the first surface 100a of the first substrate 100, and the contact plugs CT may not extend into the third isolation pattern 230.

The contact plug CT may not be disposed on the second intersection portion 2152. For example, when viewed in plan, the contact plug CT may not be provided between first, second, third, and fourth pixel regions PX1, PX2, PX3, and PX4. When viewed in plan, the contact plug CT may be spaced apart from the shared floating diffusion region sFD. The contact plug CT may be electrically separated from the shared floating diffusion region sFD and the conductive plug 370.

The previous description may be substantially identically applicable to the first substrate 100, the first wiring layer 400, the second isolation pattern 220, the gate pattern 300, the gate contact plug 360, the backside dielectric layer 500, the grid pattern 550, the protective layer 510, and the micro-lens patterns 600.

Figure 6D:
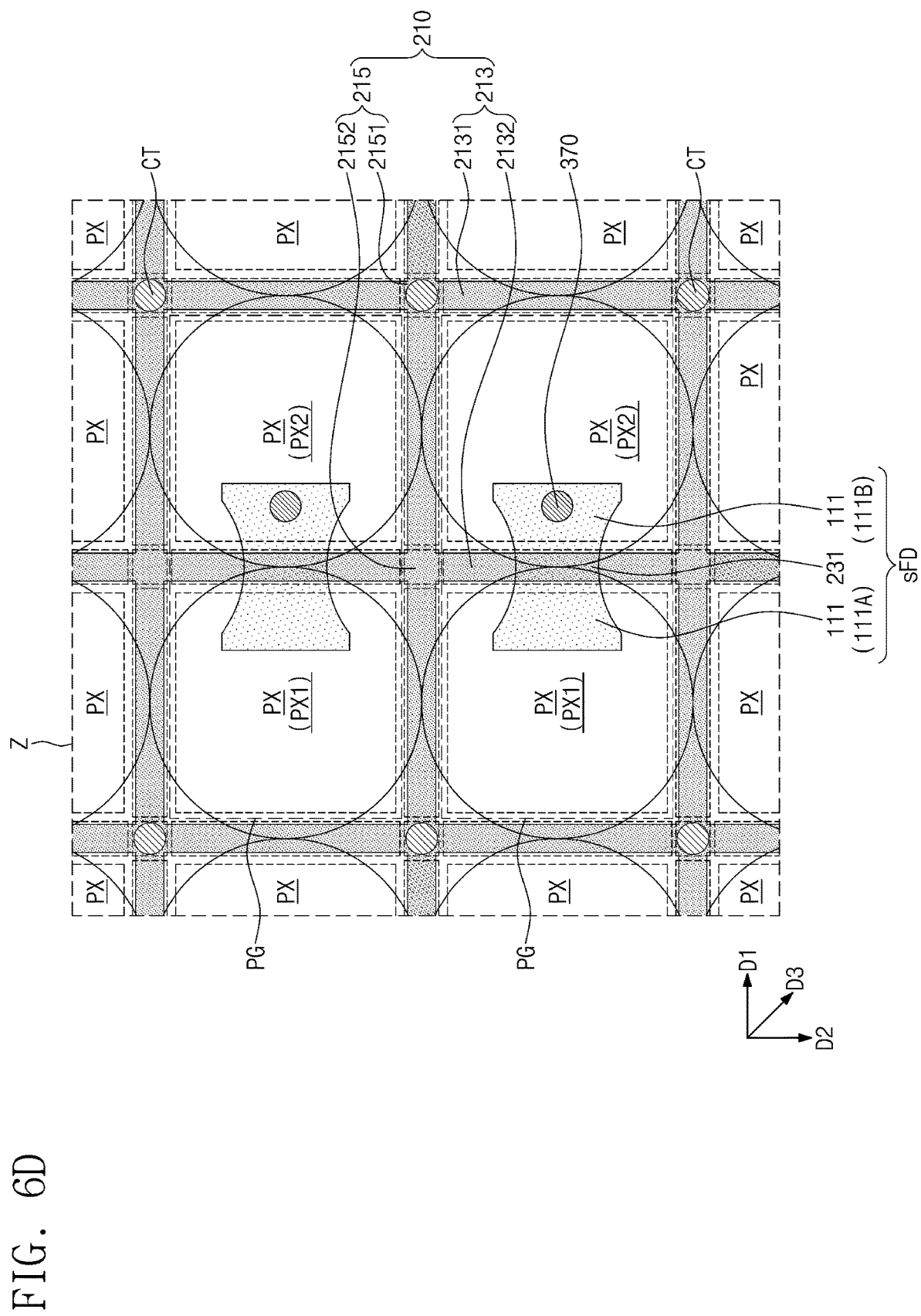
FIG. 6D illustrates a plan view showing placement of a contact plug and a shared floating diffusion region of an image sensor, according to some example embodiments.

FIG. 6D illustrates a plan view of section Z of FIG. 6A, showing placement of a contact plug and a shared floating diffusion region of an image sensor according to some example embodiments.

Referring to FIG. 6D, each pixel group PG of the image sensor may include two pixel regions PX. For example, each of the pixel groups PG may include a first pixel region PX1 and a second pixel region PX2. In this case, the shared floating diffusion region sFD may include a first impurity region 111A, a second impurity region 111B, and a doped portion 231. The first impurity region 111A may be provided on the first pixel region PX1, and the second impurity region 111B may be provided on the second pixel region PX2. The doped portion 231 may be provided between and electrically connected to the first and second impurity regions 111A and 111B. A single conductive plug 370 may be disposed on and coupled to the shared floating diffusion region sFD.

The contact plugs CT may be provided on and coupled to corresponding first intersection portions 2151. The contact plug CT may not be disposed on the second intersection portion 2152. When viewed in plan, the contact plug CT may be spaced apart from the shared floating diffusion region sFD. The contact plug CT may be electrically separated from the shared floating diffusion region sFD. The contact plug CT and the conductive plug 370 may be laterally spaced apart and electrically separated from each other.

Figure 7A:
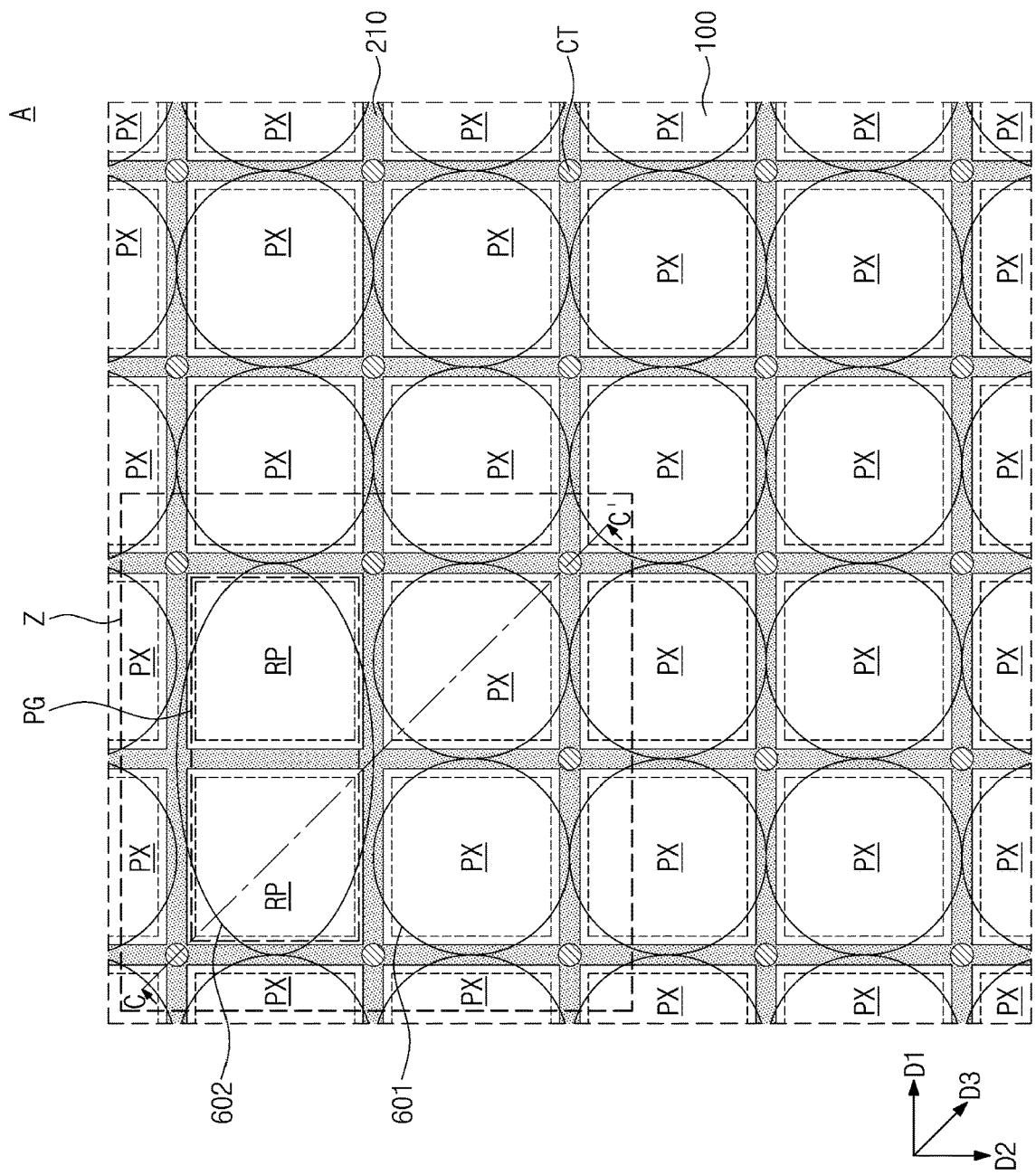
FIG. 7A illustrates a plan view showing a pixel array region of an image sensor, according to some example embodiments.
Figure 7B:
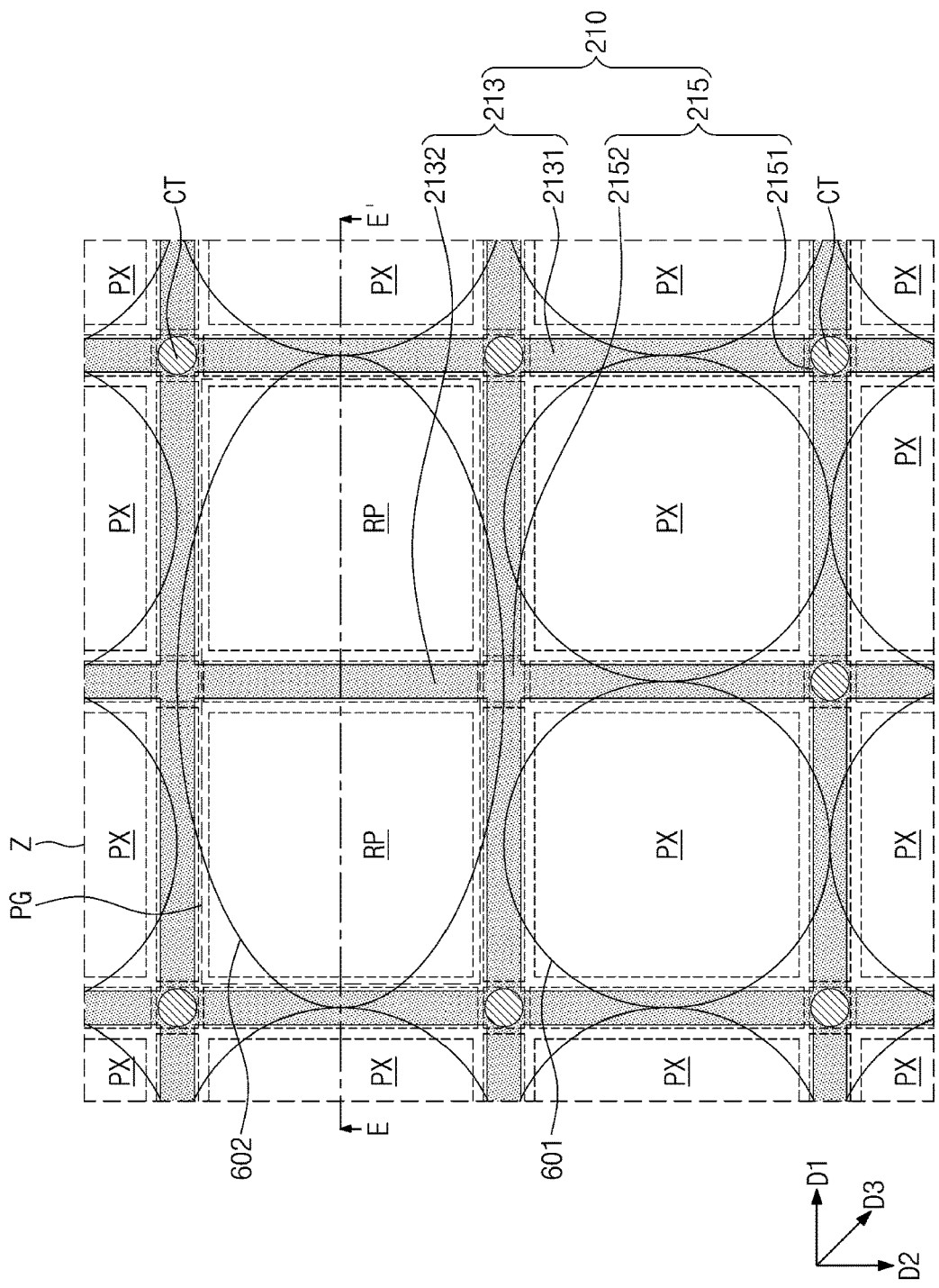
FIG. 7B illustrates an enlarged view showing section Z of FIG. 7A.
Figure 7C:
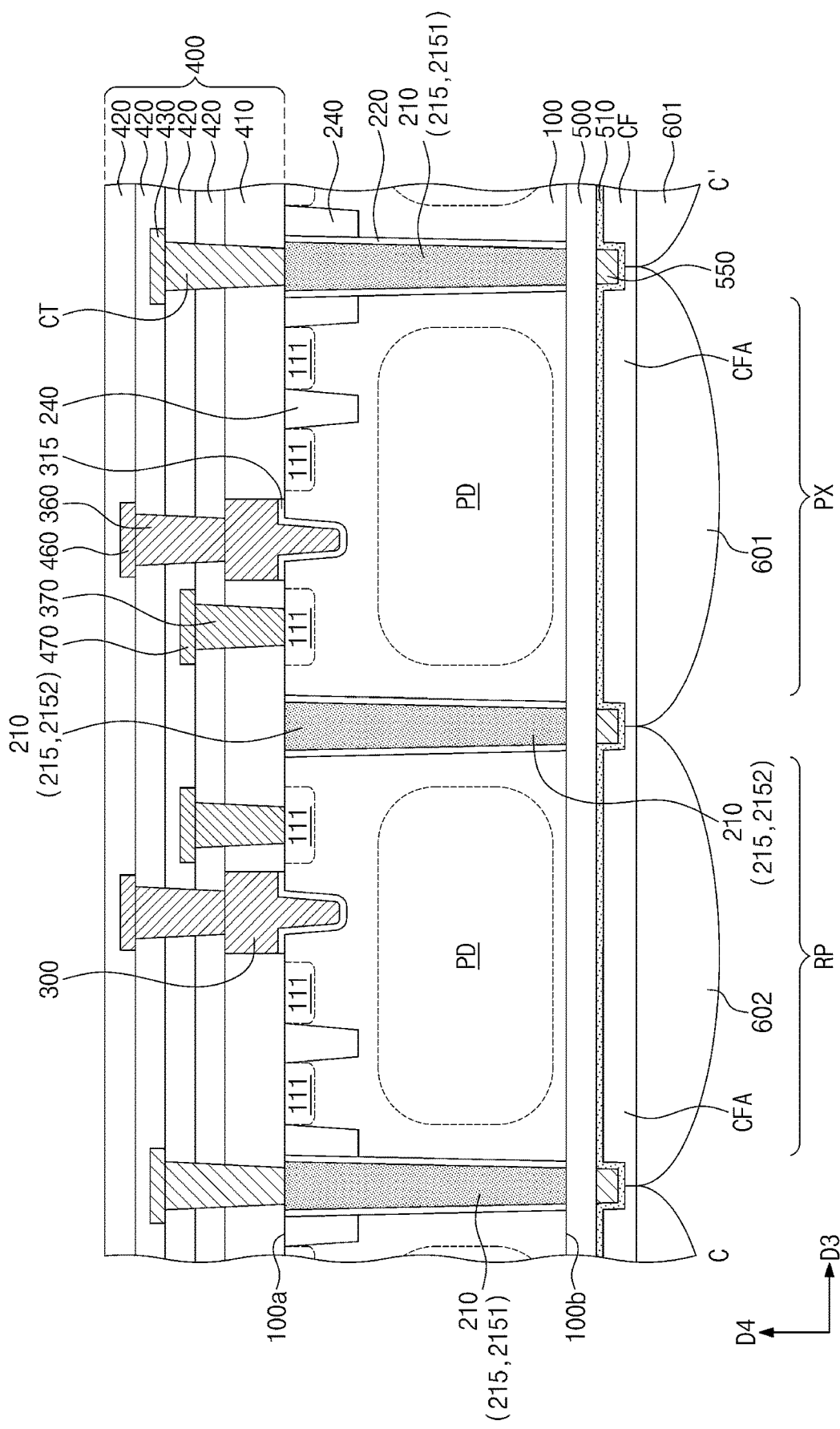
FIG. 7C illustrates a cross-sectional view taken along line C-C' of FIG. 7A.
Figure 7D:
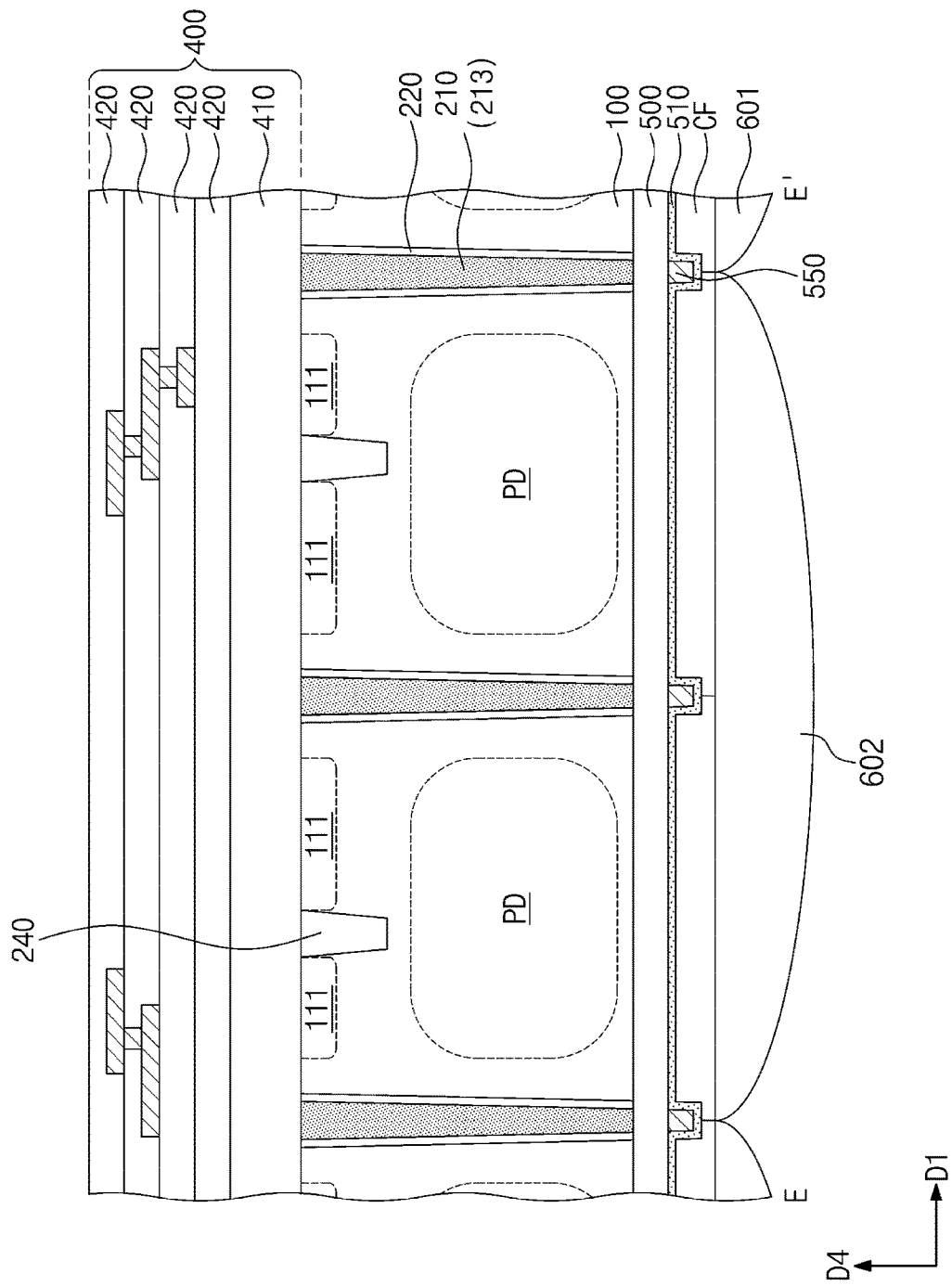
FIG. 7D illustrates a cross-sectional view taken along line E-E' of FIG. 7B.

FIG. 7A illustrates an enlarged plan view of section A of FIG. 2A, showing a pixel array region of an image sensor according to some example embodiments. FIG. 7B illustrates an enlarged view showing section Z of FIG. 7A. FIG. 7C illustrates an enlarged cross-sectional view taken along line C-C' of FIG. 7A, showing section II of FIG. 2B. FIG. 7D illustrates a cross-sectional view taken along line E-E' of FIG. 7B. Duplicate descriptions will be omitted below.

Referring to FIGS. 7A, 7B, 7C, and 7D, an image sensor may include the first substrate 100, the first wiring layer 400, the micro-lens patterns 600, the color filters CF, the first and second isolation patterns 210 and 220, and the contact plug CT.

The pixel array region APS of the first substrate 100 may include pixel regions PX and a pixel group PG. The pixel regions PX may include pixels having functions to output images of capturing-target objects, as discussed in FIG. 1.

The pixel group PG may include focus pixel regions RP. The focus pixel regions RP may be the same as the pixel regions PX in terms of shape, placement, and material. For example, the focus pixel regions RP and the pixel regions PX may be two-dimensionally arranged along rows and columns. In the first substrate 100, the photoelectric conversion regions PD, the device dielectric pattern 240, and the impurity regions 111 may be disposed on each of the focus pixel regions RP. The focus pixel regions RP may include components of focus detection pixels. The focus detection pixels may serve to correct focuses of images that are output from the pixel regions PX, but not to output images of capturing-target objects. For example, the photoelectric conversion regions PD may be spaced apart from each other when viewed in plan, and light incident on the photoelectric conversion regions PD may have different phases from each other. A phase difference between images obtained in the photoelectric conversion regions PD may be compared to correct a focus of the obtained image. For example, a photoelectric signal that is output from the focus pixel region RP and a photoelectric signal that is output from the pixel region PX may be compared with each other to correct a focus of an image that is output from the pixel region PX. Therefore, the image sensor may obtain three-dimensional depth information about capturing-target objects. For brevity of drawings, the pixel group PG is illustrated to include two focus pixel regions RP, but no limitation may be imposed on the number of the focus pixel regions RP included in the pixel group PG.

The first substrate 100 may have focus color filters CFA on the second surface 100b thereof, and the focus color filters CFA may cover the backside dielectric layer 500. The focus color filters CFA may be disposed on the second surface 100b of the first substrate 100 on corresponding focus pixel regions RP. Each of the focus color filters CFA may include a white color filter or a transparent filter. Alternatively, the focus color filters CFA may include one of red, green, and blue filters, as discussed in the example of the color filters CF. In contrast, the color filter CF may not be disposed on the focus pixel region RP.

The connection portion 213 of the first isolation pattern 210 may include first interconnection portions 2131 and a second interconnection portion 2132. When viewed in plan, the first interconnection portions 2131 may be provided outside the pixel group PG. The first interconnection portions 2131 may be disposed on sides of the pixel regions PX. For example, the first interconnection portions 2131 may be placed between the pixel regions PX or between one of the focus pixel regions RP and one of the pixel regions PX. In this case, the one of the focus pixel regions RP may be adjacent to the one of the pixel regions PX. The second interconnection portion 2132 may be disposed between neighboring focus pixel regions RP.

The intersection portion 215 of the first isolation pattern 210 may include first intersection portions 2151 and a second intersection portion 2152. The second intersection portion 2152 may be connected to the second interconnection portion 2132. For example, the second intersection portion 2152 may be a section where the second interconnection portion 2132 meets the first interconnection portions 2131. The second intersection portion 2152 may be called a focus intersection portion. Each of the first intersection portions 2151 may be a section where four first interconnection portions 2131 meet each other. The first intersection portion 2151 may be connected to the first interconnection portions 2131.

A plurality of contact plugs CT may be provided on and coupled to corresponding first intersection portions 2151. The contact plug CT may not be disposed on the second intersection portion 2152.

The first substrate 100 may have first micro-lens patterns 601 and second micro-lens patterns 602 on the second surface 100b thereof, and the first and second micro-lens patterns 601 and 602 may cover the backside dielectric layer 500. The first micro-lens patterns 601 may be substantially the same as the micro-lens patterns 600 of FIGS. 3A to 3D. In contrast, the first micro-lens pattern 601 may not be disposed on the focus pixel region RP.

The second micro-lens patterns 602 may be disposed on the pixel group PG and may overlap the focus pixel regions RP. For example, the focus pixel regions RP of the pixel group PG may share the second micro-lens patterns 602. The second micro-lens patterns 602 may include either a photoresist material or a polymer such as a thermosetting resin.

The previous description may be substantially identically applicable to the first substrate 100, the first wiring layer 400, the gate pattern 300, the gate contact plug 360, the second isolation pattern 220, the backside dielectric layer 500, the grid pattern 550, and the protective layer 510.

Figure 8:
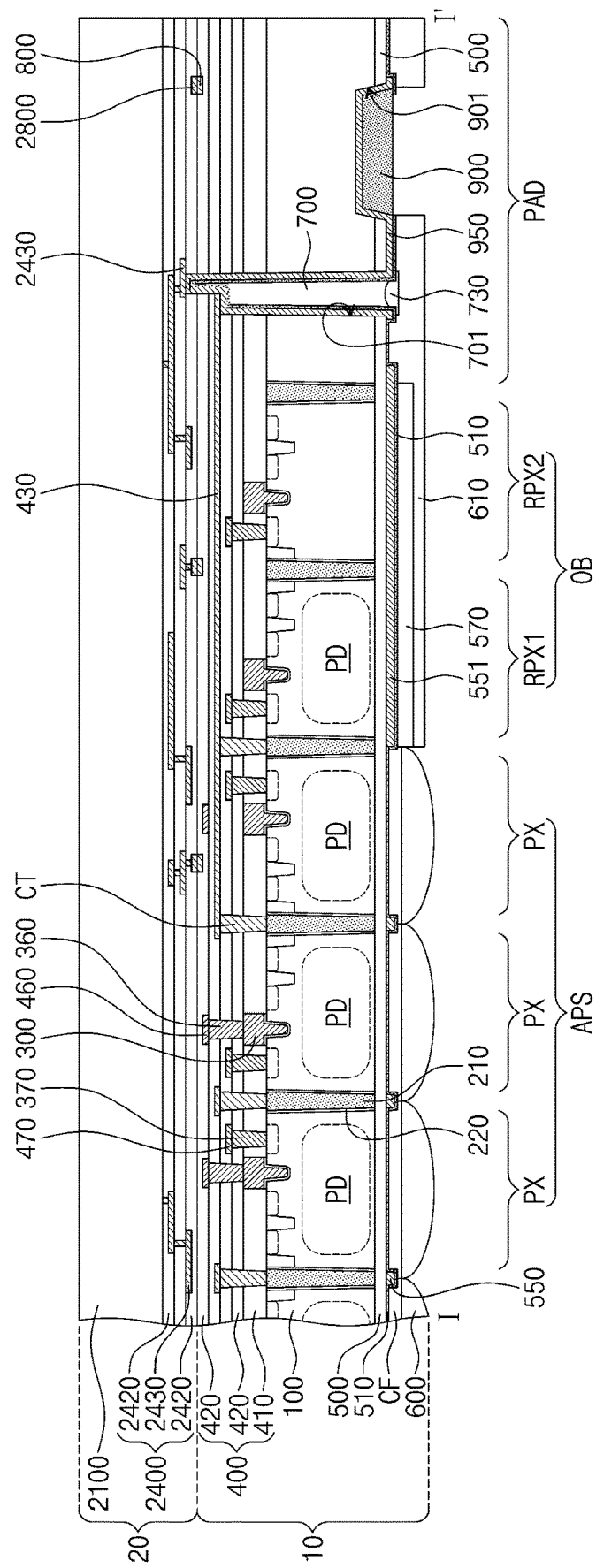
FIG. 8 illustrates a cross-sectional view taken along line I-I' of FIG. 2A, showing an image sensor, according to some example embodiments.

FIG. 8 illustrates a cross-sectional view taken along line I-I' of FIG. 2A, showing an image sensor according to sonic example embodiments. The following will refer to FIG. 2A together with FIG. 8, and a repetitive description will be omitted below.

Referring to FIG. 8, an image sensor may include a sensor chip 10 and a circuit chip 20. The sensor chip 10 and the circuit chip 20 may be substantially the same as those discussed above with reference to FIGS. 2A and 2B, For example, the sensor chip 10 may include the first substrate 100, the first wiring layer 400, the first and second isolation patterns 210 and 220, the contact plug CT, the pad terminal 900, and the conductive pattern 950. The circuit chip 20 may include the second substrate 2100 and the second wiring layer 2400. The first and second wiring layers 400 and 2400 may be disposed between the first substrate 100 and the second substrate 2100.

In contrast, the sensor chip 10 may include a first connection pad 800. The first connection pad 800 may be exposed on a top surface of the sensor chip 10. For example, the first connection pad 800 may be disposed in an uppermost second dielectric layer 420 of the first wiring layer 400. The first connection pad 800 may have a top surface at substantially the same level as that of a top surface of the uppermost second dielectric layer 420. The first connection pad 800 may include a conductive material, such as metal. For example, the first connection pad 800 may include copper. For another example, the first connection pad 800 may include aluminum, tungsten, titanium, or any alloy thereof. The uppermost second dielectric layer 420 may include a silicon-based dielectric material, such as silicon oxide or silicon nitride. One of the first line pattern 460, the second line pattern 470, and the conductive pattern 950 may be electrically connected to the first connection pad 800.

The circuit chip 20 may include a second connection pad 2800. The second connection pad 2800 may be exposed on a bottom surface of the circuit chip 20. For example, the second connection pad 2800 may be disposed in a lowermost third dielectric layer 2120. The second connection pad 2800 may have a bottom surface at substantially the same level as that of a bottom surface of the lowermost third dielectric layer 2420. The second connection pad 2800 may be electrically connected to the third line patterns 2430. Therefore, the second connection pad 2800 may be electrically connected through the third line patterns 2430 to integrated circuits on the second substrate 2100. The second connection pad 2800 may include a conductive material, such as metal. For example, the second connection pad 2800 may include copper. For another example, the second connection pad 2800 may include aluminum, tungsten, titanium, or any alloy thereof. The lowermost third dielectric layer 2420 may include a silicon-based dielectric material, such as silicon oxide or silicon nitride.

The circuit chip 20 and the sensor chip 10 may be connected together by direct bonding. For example, the first connection pad 800 and the second connection pad 2800 may be vertically aligned and in contact with each other. Therefore, the second connection pad 2800 may be directly bonded to the first connection pad 800. Electrical signals from integrated circuits of the circuit chip 20 may be transferred to either the pad terminal 900 or transistors of the sensor chip 10 through the third line patterns 2430, the second connection pad 2800, the first connection pad 800, and the first wiring layer 400. The lowermost third dielectric layer 2420 may be directly bonded to the uppermost second dielectric layer 420. In this case, a chemical bond may be provided between the lowermost third dielectric layer 2420 and the uppermost second dielectric layer 420.

The color filters CF and the micro-lens patterns 600 may be disposed on the second surface 100b of the first substrate 100.

According to the present inventive concepts, contact plugs may be disposed on edge and central portions of a pixel array region. A first voltage may be directly transmitted through the contact plugs to a first isolation pattern on the central portion of the pixel array region. Accordingly, it may be possible to avoid a RC delay phenomenon of the first voltage. It may also be possible to improve image quality of an image sensor.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:
1. An image sensor, comprising:
 a substrate having a first surface and a second surface opposite each other, the substrate comprising a pixel array region and an optical black region adjacent to the pixel array region;
 a first pixel region of the pixel array region;
 a second pixel region of the pixel array region;
 a first trench on the pixel array region and in contact with the first surface and the second surface, the first trench between the first pixel region and the second pixel region in the substrate;
 a first isolation pattern in the first trench and in contact with the first surface and the second surface;
 a contact plug extending into the substrate from the first surface and in contact with the first isolation pattern; and
 a light-shield pattern on the optical black region of the substrate,
 wherein the image sensor is configured to receive light from the second surface,
 wherein the first isolation pattern includes an intersection portion and a connection portion extending from the intersection portion in a first direction and a second direction perpendicular to the first direction, and wherein the contact plug vertically overlaps with the intersection portion.

2. The image sensor of claim 1, wherein, when viewed in plan, the contact plug is in an area surrounded by central points of a plurality of pixel regions of the pixel array region including the first pixel region and the second pixel region . . .

3. The image sensor of claim 1, further comprising:
a wiring structure on the first surface and configured to electrically connect to the contact plug.

4. The image sensor of claim 3,
wherein the first isolation pattern comprises a silicon-based dielectric material.

5. The image sensor of claim 4, wherein the first pixel region comprises a first shallow trench isolation layer on the first surface.

6. The image sensor of claim 5,
wherein the first pixel region further comprises a transfer gate and a ground region, and
wherein the first shallow trench isolation layer is disposed between the transfer gate and the ground region.

7. The image sensor of claim 6, wherein a portion of the transfer gate extends into the substrate from the first surface.

8. The image sensor of claim 1, further comprising:
a third pixel region directly adjacent to the first pixel region;
a first color filter on the first and third pixel regions; and
a second color filter on the second pixel region,
wherein the third, first, and second pixel regions are sequentially arranged in the first direction, and
wherein the first color filter is different from the second color filter.

9. The image sensor of claim 8, further comprising:
a fourth pixel region directly adjacent to the first pixel region,
wherein the first color filter is disposed on the first, third, and the fourth pixel regions, and
wherein the fourth pixel region is disposed directly adjacent to the first pixel region in the second direction.

10. The image sensor of claim 9, further comprising:
a shared floating diffusion region shared by the first, third, and fourth pixel regions.

11. The image sensor of claim 10, wherein the first isolation pattern further comprises a crystalline semiconductor material.

12. The image sensor of claim 1, wherein the first isolation pattern is configured to receive a negative bias voltage from a wiring structure.

13. The image sensor of claim 12, wherein a concentration of dopants in the first isolation pattern is equal to or less than about $10^{15}$ ions/cm$^3$.

14. The image sensor of claim 1, wherein the first pixel region further comprises a second shallow trench isolation layer on the first surface.

15. An image sensor, comprising:
a substrate comprising a first surface and a second surface opposite the first surface;
a first pixel group comprising a plurality of pixel regions;
a second pixel group comprising a plurality of pixel regions;
a third pixel group comprising a plurality of pixel regions;
a fourth pixel group comprising a plurality of pixel regions;
a first trench at a central point surrounded by the first to fourth pixel groups in a plan view, wherein the first trench is in contact with the first surface and the second surface;
a first isolation pattern in the first trench; and
a contact plug extending into the substrate from the first surface and in contact with the first isolation pattern, and
wherein the image sensor is configured to receive light through the second surface.

16. The image sensor of claim 15, further comprising:
a first color filter on the first pixel group; and
a second color filter on the second pixel group,
wherein the first color filter includes a different color filter from the second color filter.

17. The image sensor of claim 16, wherein the first pixel group comprising:
four pixel regions; and
four micro-lenses on the four pixel regions.

18. The image sensor of claim 17, wherein the first pixel group further comprises:
a second trench between the four pixel regions; and
a second isolation pattern in the second trench, and
wherein the second trench is in contact with the first surface and the second surface.

19. The image sensor of claim 18, wherein the first isolation pattern comprises:
a silicon-based dielectric material and a crystalline semiconductor material.

20. The image sensor of claim 19, further comprising:
a transfer gate in the first pixel group,
wherein a portion of the transfer gate extends into the substrate from the first surface.

* * * * *